US008969929B2

(12) United States Patent
 Sakanishi et al.

(10) Patent No.: US 8,969,929 B2
(45) Date of Patent: Mar. 3, 2015

(54) POWER SEMICONDUCTOR DEVICE HAVING GATE ELECTRODE COUPLING PORTIONS FOR ETCHANT CONTROL

(75) Inventors: Koichiro Sakanishi, Kawasaki (JP); Tsuyoshi Kachi, Kawasaki (JP); Koji Fujishima, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 633 days.

(21) Appl. No.: 13/238,849

(22) Filed: Sep. 21, 2011

(65) Prior Publication Data
 US 2012/0074472 A1    Mar. 29, 2012

(30) Foreign Application Priority Data

Sep. 27, 2010 (JP) ................................. 2010-214822

(51) Int. Cl.
 *H01L 29/76*     (2006.01)
 *H01L 29/423*    (2006.01)
 (Continued)

(52) U.S. Cl.
 CPC ...... *H01L 29/4238* (2013.01); *H01L 29/66719* (2013.01); *H01L 29/66727* (2013.01); *H01L 29/7811* (2013.01); *H01L 29/0619* (2013.01); *H01L 29/0696* (2013.01);
 (Continued)

(58) Field of Classification Search
 CPC .................. H01L 29/66719; H01L 29/66727; H01L 29/4238; H01L 29/0619; H01L 29/0696; H01L 29/1095; H01L 29/41766; H01L 29/7811; H01L 29/456; H01L 29/78; H01L 27/1104

USPC .......... 257/287, 341, 401, 500, 409, E29.255, 257/E29.257, E21.418, E29.012, E29.013, 257/691, 494, 288, 207, E23.079
See application file for complete search history.

(56) References Cited

U.S. PATENT DOCUMENTS 7,456,471 B2 * 11/2008 Anderson et al. ............. 257/331
7,538,377 B2    5/2009 Takaishi
(Continued)

FOREIGN PATENT DOCUMENTS

JP          2006-54483         2/2006

OTHER PUBLICATIONS

Official Action dated Feb. 26, 2014 issued in Japanese counterpart application (No. 2010-214822) with English translation.

*Primary Examiner* — Cuong Q Nguyen
*Assistant Examiner* — Yosef Gebreyesus
(74) *Attorney, Agent, or Firm* — Womble Carlyle

(57) ABSTRACT

A general insulated gate power semiconductor active element with many gate electrodes arranged in parallel has a laminated structure including a barrier metal film and a thick aluminum electrode film formed over the gate electrodes via an interlayer insulating film. When the aluminum electrode film is embedded in between the gate electrodes in parallel, voids may be generated with the electrodes. Such voids allow the etchant to penetrate in wet etching, which may promote the etching up to a part of the electrode film in an active cell region which is to be left. Thus, an insulated gate power semiconductor device is provided to include gate electrodes protruding outward from the inside of the active cell region, and a gate electrode coupling portion for coupling the gate electrodes outside the active cell region. The gate electrode coupling portion is covered with a metal electrode covering the active cell region.

20 Claims, 22 Drawing Sheets

(51) Int. Cl.
*H01L 29/66* (2006.01)
*H01L 29/78* (2006.01)
*H01L 29/06* (2006.01)
*H01L 29/10* (2006.01)
*H01L 29/417* (2006.01)
*H01L 29/45* (2006.01)
*H01L 29/49* (2006.01)

(52) U.S. Cl.
CPC ...... *H01L 29/1095* (2013.01); *H01L 29/41766* (2013.01); *H01L 29/456* (2013.01); *H01L 29/4933* (2013.01)
USPC ............... 257/288; 257/287; 257/E29.255; 257/E29.257

(56) References Cited

U.S. PATENT DOCUMENTS

| | | | |
|---|---|---|---|
| 7,679,136 B2 | 3/2010 | Kachi et al. | |
| 7,759,737 B2* | 7/2010 | Cho et al. | 257/347 |
| 7,898,041 B2* | 3/2011 | Radosavljevic et al. | 257/401 |
| 2004/0067617 A1* | 4/2004 | Hower et al. | 438/259 |
| 2006/0197146 A1* | 9/2006 | Hokomoto et al. | 257/328 |
| 2007/0228534 A1* | 10/2007 | Uno et al. | 257/678 |
| 2008/0265314 A1* | 10/2008 | Kobayashi | 257/330 |
| 2011/0037120 A1* | 2/2011 | Chen et al. | 257/331 |

* cited by examiner

POWER SEMICONDUCTOR DEVICE HAVING GATE ELECTRODE COUPLING PORTIONS FOR ETCHANT CONTROL

CROSS-REFERENCE TO RELATED APPLICATIONS

The disclosure of Japanese Patent Application No. 2010-214822 filed on Sep. 27, 2010 including the specification, drawings and abstract is incorporated herein by reference in its entirety.

BACKGROUND

The present invention relates to a technique effectively applied to a layout technology of a power semiconductor device (or semiconductor integrated circuit device).

Japanese Unexamined Patent Publication No. 2006-228882 (Patent Document 1) discloses a technique for avoiding undesired etching of an interlayer insulating film from its side by burying an integral polysilicon strip intersecting a word line when forming a polysilicon burying a contact in a dynamic random access memory (DRAM) chip.

Japanese Unexamined Patent Publication No. 2006-54483 (Patent Document 2) discloses a gate electrode having a structure with an inside region thereof removed in a planar vertical power MOSFET for the purpose of reduction in gate capacitance.

SUMMARY

An insulated gate power semiconductor active element, such as a power MOSFET, presently includes a number of gate electrodes arranged linearly in parallel, an interlayer insulating film covering the gate electrodes, a relatively thin barrier metal film, and a relatively thick aluminum electrode film which are laminated over the insulating film. When a region between the gate electrodes extending in parallel is buried in the thick aluminum electrode film, a void extending together with the gate electrode is generated at the center of the buried region in many cases. Such a void may possibly lead to failures in metal process treatment.

Specifically, when the aluminum electrode film is patterned, for example, by wet etching with an elongated void formed in the electrode film, the etching solution would penetrate the electrode film through the elongated void to etch a part of the aluminum electrode film which is to be essentially left, that is, an active cell part.

The invention of the present application has been made so as to solve the foregoing problems.

Accordingly, it is an object of the invention to provide a power semiconductor device with high reliability.

The above and other objects and the novel features of the invention will become apparent from the description of the present specification and the accompanying drawings.

The outline of representative aspects of the invention disclosed in the present application will be briefly described below.

That is, one aspect of the invention disclosed in the present application is directed to an insulated gate power semiconductor device which includes a plurality of gate electrodes provided via a gate insulating film to protrude outward from the inside of an active cell region, and a gate electrode coupling portion for coupling the gate electrodes outside the active cell region. The gate electrode coupling portion is covered with a metal electrode covering the active cell region.

The effects obtained by representative aspects of the invention disclosed in the present application will be briefly described below.

That is, the insulated gate power semiconductor device includes a plurality of gate electrodes provided via a gate insulating film to protrude outward from the inside of an active cell region, and a gate electrode coupling portion for coupling the gate electrodes outside the active cell region. The gate electrode coupling portion is covered with a metal electrode covering the active cell region. This arrangement can prevent the introduction of defects due to a manufacturing process.

BRIEF DESCRIPTION OF THE DRAWINGS

FIGS. 13-22 are all cross-sectional views substantially taken along the line A-A' of FIG. 6 for explaining a main part of the wafer process line of a power MOSFET in accordance with one embodiment of the present invention, and showing the device at different stages of formation, with:

FIG. 13 showing the power MOSFET from the step of forming a gate insulating film to the step of depositing a hard mask film made of silicon oxide;

FIG. 14 showing the power MOSFET in the step of processing the gate electrode or the like;

FIG. 15 showing the power MOSFET in the step of introduction of ions to form a P-type base region;

FIG. 16 showing the power MOSFET in the step of introduction of ions to form an N-type source extension region;

FIG. 17 showing the power MOSFET in the step of forming a sidewall;

FIG. 18 showing the power MOSFET in the step of introduction of ions to form an $N^+$-type source region;

FIG. 19 showing the power MOSFET in the step of forming a contact hole and the like;

FIG. 20 showing the power MOSFET in the step of depositing a barrier metal film;

FIG. 21 showing the power MOSFET in the step of wet-etching an aluminum metal electrode film; and FIG. 22 showing the power MOSFET in the step of dry-etching a barrier metal film.

DETAILED DESCRIPTION

Figure 1:
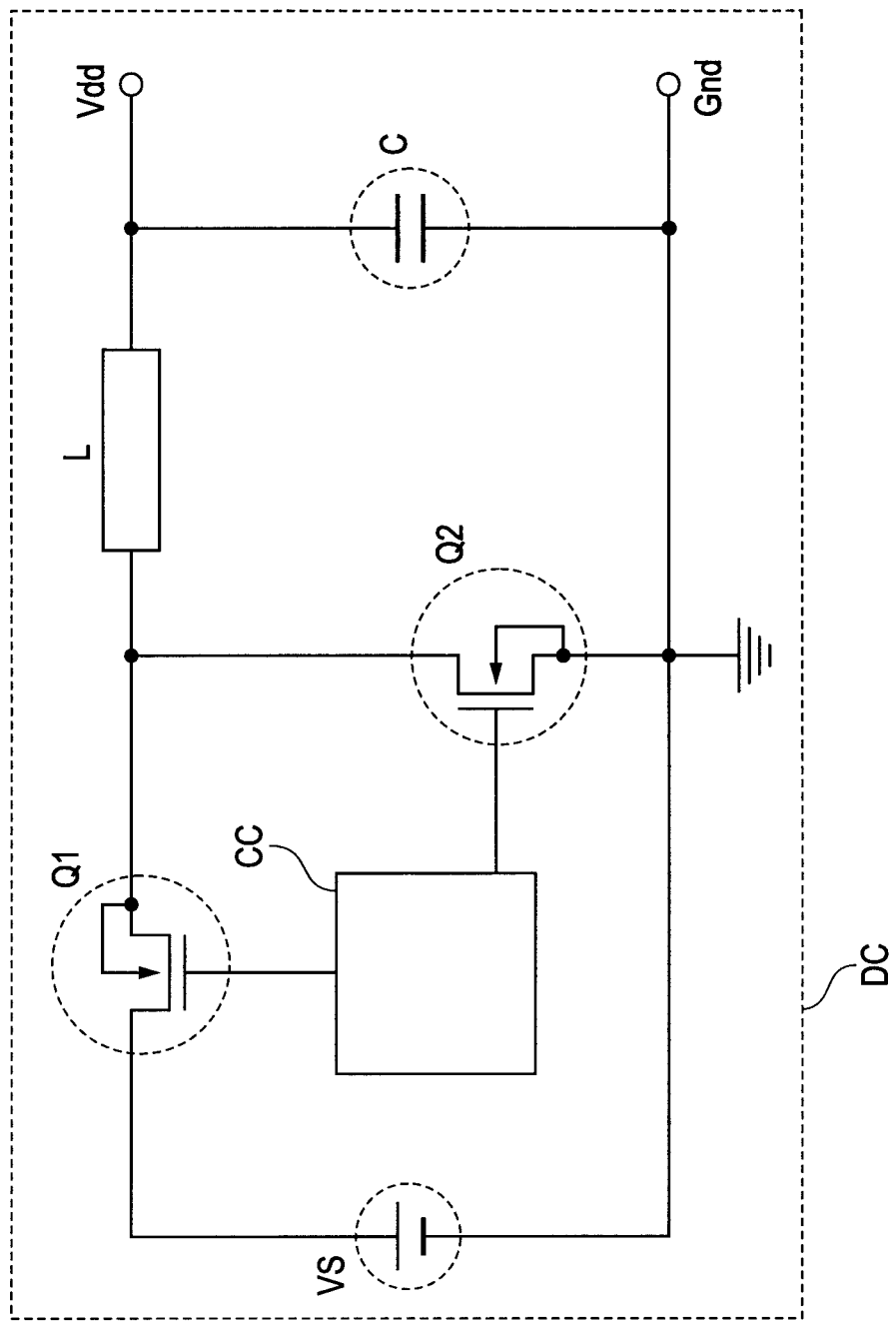
FIG. 1 is a circuit diagram of a DC-DC down-converter for explaining typical applications, such as a power MOSFET, which is one example of a power semiconductor device according to one embodiment of the invention in the present application.

First, the outline of representative preferred embodiments of the invention disclosed in the present application will be described below.

1. A power semiconductor device according to a first aspect of the invention includes: (a) a semiconductor chip with first and second main surfaces; (b) a plurality of gate electrodes provided via a gate insulating film so as to protrude outward from an inside of an active cell region over the first main surface of the semiconductor chip; (c) a gate electrode coupling portion integrally coupling intermediate parts of the gate electrodes together outside the active cell region over the first main surface of the semiconductor chip; (d) an interlayer insulating film covering the gate electrodes and the gate electrode coupling portion over the first main surface of the semiconductor chip; and (e) a first metal electrode covering the active cell region and surroundings thereof over the interlayer insulating film. The gate electrode coupling portion between the gate electrodes is covered with the first metal electrode. The first metal electrode includes (e1) a barrier metal film; and (e2) a metal electrode film provided over the barrier metal film so as to be thicker than the barrier metal film, and comprised of aluminum as a principal component.

2. In the semiconductor device according to the first aspect, the gate electrode couplings are provided close to each other.

3. In the semiconductor device according to the first or second aspect, the gate electrode coupling portion is substantially linear.

4. In the semiconductor device according to any one of the first to third aspects, the gate electrode coupling portion has substantially the same width as that of each of the gate electrodes.

5. In the semiconductor device according to any one of the first to third aspects, the width of the gate electrode coupling portion is wider than that of each of the gate electrodes.

6. In the semiconductor device according to any one of the first to fifth aspects, the gate electrode coupling portion is formed of the same layer material as that of the gate electrodes.

7. In the semiconductor device according to any one of the first to sixth aspects, the power semiconductor device is a power MISFET including a linear gate electrode structure.

8. In the semiconductor device according to any one of the first to seventh aspects, the power semiconductor device is a power MISFET having a planar structure.

9. In the semiconductor device according to any one of the first to seventh aspects, the power semiconductor device is a split gate power MISFET having a planar structure.

10. In the semiconductor device according to any one of the first to ninth aspects, no insulating film which is thicker than the gate insulating film exists between the first main surface of the semiconductor chip and the gate electrode coupling portion.

Explanation of Description Format, Basic Terms, and Usage in Present Application 1. In the present application, the description of the following preferred embodiments may be divided into sections, for convenience if necessary, but these embodiments are not independent from each other except when specified otherwise. These embodiments correspond to the respective parts of a single example. Alternatively, one of the embodiments is a modified example of a detailed part, a part, or all of the other. The repeated description of the same part will be omitted below in principal. Further, a specific value regarding the respective components or the like of the following embodiments is not essential except when specified otherwise, except when clearly limited thereto in principal, and unless the context clearly indicates otherwise.

Further, the term "transistor", "semiconductor device", or "semiconductor integrated circuit device" as used in the present application mainly means various kinds of single transistors (active elements), or devices essentially including such transistors with a resistor, a capacitor, and the like, which are integrated on a semiconductor chip or the like (for example, a monocrystalline silicon substrate). Various typical transistors can include, for example, a metal insulator semiconductor field effect transistor (MISFET), typified by a metal oxide semiconductor field effect transistor (MOSFET). The term "MOSFET" as used in the present application may include not only a transistor using a gate insulating film made of an oxide film, but also a transistor using a gate insulating film made of any insulating film other than the oxide film.

2. Likewise, in the description of the embodiments or the like, the phrase "X made of A" about material, composition, or the like does not exclude a member containing an element other than A as a principal component, except when specified otherwise, and unless the context clearly indicates otherwise. For example, as to the component, the above phrase means "X containing A as a principal component" or the like. It is apparent that for example, the term "a silicon member" or the like is not limited to pure silicon, and may mean a member including a multicomponent alloy containing SiGe alloy or other silicon materials as a principal component, and other additives or the like. Likewise, it is apparent that the term "silicon oxide film", "silicon-oxide-based insulating film", or the like means not only a film made of relatively pure undoped silicon dioxide; but also a thermally-oxidized film made of fluorosilicate glass (FSG), TEOS-based silicon oxide, silicon oxicarbide (SiOC), carbon-doped silicon oxide, organosilicate glass (OSG), phosphorus silicate glass (PSG), borophosphosilicate glass (BPSG), or the like; a CVD oxide film; a coating type silicon oxide film made of spin on glass (SOG), nano-clustering silica (NCS), or the like; a silica-based Low-k insulating film (porous insulating film) provided by introducing holes into the same member as the above-mentioned film; and a composite film of another silicon-based insulating film containing the above material as a principal component.

3. Likewise, it is apparent that preferred examples of diagrams, positions, properties, and the like will be described below in the embodiments, but the invention is not strictly limited thereto except when specified otherwise, and except when indicated otherwise from the context.

4. Further, when referring to a specific value or quantity, the invention may have a value exceeding the specific value, or may have a value less than the specific value except when specified otherwise, except when limited to the specific value, and except when clearly indicated otherwise from the context, in theory.

5. The term "wafer" generally indicates a single crystal silicon wafer over which a semiconductor device (note that the same goes for a semiconductor integrated circuit device, and an electronic device) is formed, but may include a composite wafer comprised of an insulating substrate, such as an epitaxial wafer, an SOI wafer, or a LCD glass substrate, and a semiconductor layer or the like.

6. The term "power semiconductor" as used in the present application indicates a semiconductor device which can handle power of several watts or more. A power MOSFET, a power insulated gate bipolar transistor (IGBT), and the like belong to an "insulated gate power transistor". Therefore, all normal power MOSFETs are included in the "power semiconductor".

A power MOSFET having a source at the front surface thereof and a drain at the back surface thereof is regarded as a vertical power MOSFET.

The "trench-gate power MOSFET" among the vertical power MOSFETs is a MOSFET which normally includes a gate electrode made of polysilicon or the like in a trench (relatively elongated groove) formed at a device surface (first main surface) of a semiconductor substrate with a channel formed in the direction of thickness of the semiconductor substrate (in the longitudinal direction). In this case, the device surface side of the semiconductor substrate serves as the source, and the back surface side (second main surface side) of the semiconductor substrate serves as the drain.

A part of the main part of the gate electrode (part except for an electrode lead portion) may extend off the trench.

An insulated gate bipolar transistor (IGBT) is provided by adding a collector layer of a conduction type different from that of a drain region onto the drain side of a vertical power MOSFET, from the structural viewpoint. The source of the vertical power MOSFET as a component is called "emitter" for practical purposes. In the present application, except when especially the term "emitter" needs to be used, this component of the original vertical power MOSFET is represented by the "source". The terms "source", "source region", "source electrode", and the like are also used in this case. Since the IGBT has substantially the same layout of the device surface as that of the vertical power MOSFET, the following description on the vertical power MOSFET can be applied to the IGBT in the preferred embodiments of the invention in the present application.

DETAILED DESCRIPTION OF PREFERRED EMBODIMENTS

The preferred embodiments will be further described below in detail. In each drawing, the same or similar part is designated by the same or similar reference character or numeral, and a description thereof will not be repeated in principal.

In the accompanied drawings, hatching or the like will be omitted even in some cross-sectional views when a hatched part possibly becomes complicated or when a part to be hatched is clearly distinguished from a space. In this context, even the outline of a hole planarly closed may be omitted as is evident from the description or the like. In order to clearly demonstrate that a part of interest is not a void, hatching may be given to a drawing which is not a cross-sectional view.

1. Explanation of Typical Applications of Power MOSFET and the like as One Example of Power Semiconductor Device in One Embodiment of the Invention in Present Application In this section, in order to clearly define the characteristics of the power MOSFET as one example of the power semiconductor device of the one embodiment in the present application, a typical application circuit will be described below by way of example. It goes without saying that the power semiconductor device (especially, an insulated gate power active element), such as the power MOSFET, as described in the present application is not limited to such a specific application.

FIG. 1 is a circuit diagram of a DC-DC down-converter for explaining a typical application of the power MOSFET and like as one example of the power semiconductor device according to one embodiment of the invention in the present application.

As shown in FIG. 1, the DC-DC down-converter (DC) decreases a power-supply voltage (for example, of about 15 to 20 volts) supplied from a voltage source VS by on/off control using an upper side first MOSFET (Q1) which is controlled by a control circuit CC. An output is produced as a low voltage of the DC power supply (for example, of about 1 volt, 3 volts, 5 volts, and the like) from an output terminal Vdd of the power supply and a ground terminal Gnd through a smoothing circuit comprised of an inductance element L and a capacitor C. The lower side second MOSFET (Q2) is an active switch instead of a free wheel diode.

The power MOSFET which is one example of the power semiconductor device according to one embodiment of the invention in the present application is mainly used as an upper-side MOSFET (Q1) in the example of application.

2. Explanation of Outline of Gate Electrode Layout Corresponding to Semiconductor Device in One Embodiment of the Invention in Present Application In this section, the outline of the gate electrode corresponding to the semiconductor device of the one embodiment will be described below by taking a simple layout of the power MOSFET described in section 1 as an example. The layout below in the example shown in FIG. 2 is basically the same as that shown in each of FIGS. 5 to 9, but is a simpler embodiment for convenience of explanation.

Figure 2:
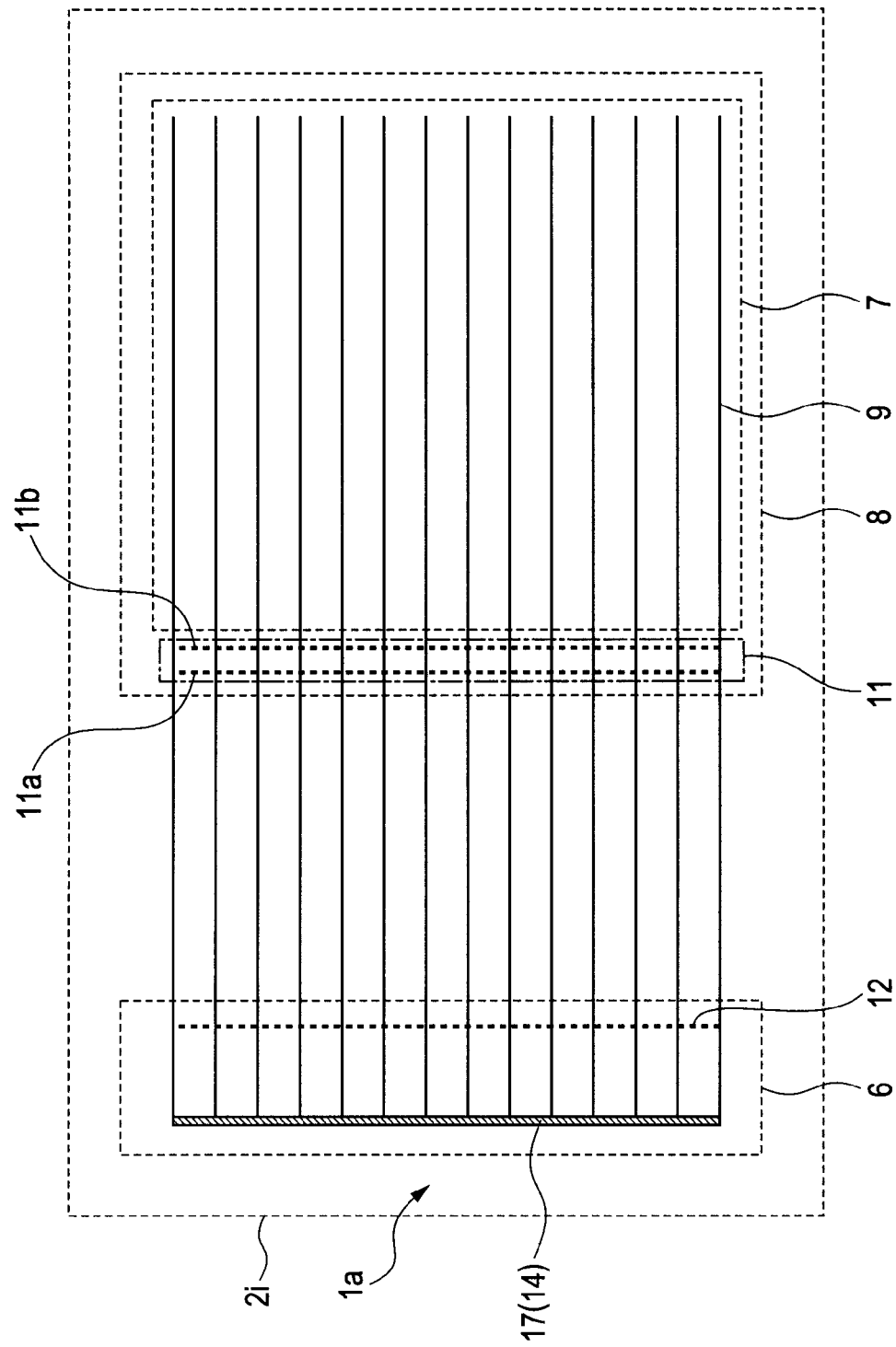
FIG. 2 is an extensive plan view of an inner region at an upper surface of a chip for explaining the outline of a gate electrode layout corresponding to the semiconductor device of the present application (in which a gate electrode coupling portion near the cell is comprised of a plurality of coupling bars.

FIG. 2 is an extensive plan view of an inner region at an upper surface 1a of a chip for explaining the outline of a gate electrode layout corresponding to the semiconductor device of the one embodiment of the present application (in which a gate electrode coupling portion near a cell is comprised of a plurality of coupling bars in the one embodiment). Based on this figure, the outline of the gate electrode layout corresponding to the semiconductor device according to one embodiment of the invention in the present application will be described below.

FIG. 2 shows the outline of the layout of an inside region 2i of a semiconductor chip upper surface 1a including an active cell region 7, a gate electrode end 17, and the like. As shown in FIG. 2, in this example, a number of gate electrodes 9 extend in parallel substantially at equal intervals (note that in the example described in section 4 or the like, the gate electrodes are not necessarily arranged at equal intervals) almost across the active cell region 7 towards the outside. The gate electrodes 9 are intercoupled to each other by a gate wiring 14 as a lower layer ("lower layer gate wiring") outside the active cell region 7. It is not essential that the gate electrodes are coupled at this part, and are intercoupled to each other (because they are intercoupled to each other by an aluminum metal layer as an upper layer).

For present purposes, the region outside and immediately adjacent to the active cell region 7 is considered to be a "non-cell region". A first gate electrode coupling portion 11 near the cell has a dam structure (near-cell dam structure) for preventing failures in the manufacturing process of a metal source electrode 8 (first metal electrode) located in the vicinity of the outside of the active cell region 7, i.e., located in the non-cell region immediately adjacent to the active cell region 7. The first gate electrode coupling portion 11 may be comprised of, for example, two near-cell parallelly extending gate electrode coupling bars 11a and 11b (note that the upper sides of these gate electrode coupling portions need to be covered with the metal source electrode 8). The first gate electrode coupling 11 and its near-cell gate electrode coupling bars 11a and 11b are integrally formed of the same material layer as the gate electrode 9, are formed at the same time as the gate electrode and so generally occupy a same depth level in the device. Such gate electrode coupling bars 11a and 11b are provided next to each other, which is effective in terms of occupation area.

The number of near-cell gate electrode coupling bars forming the near-cell gate electrode coupling portion 11 may be a value other than two as described later. As the number of the coupling bars becomes more, the dam characteristics are improved. In contrast, a distance between the outer edge of the active cell region 7 and the outer edge of the metal source electrode 8 is made longer to thus increase an occupation area of the metal source electrode 8.

Such a dam structure works not only near the outer edge of the active cell region 7, but also under the gate wiring 6 (aluminum gate wiring) as the upper layer ("upper layer gate wiring") near the gate electrode end 17. This is a second gate electrode coupling portion 12 at the end of the gate. Like the near-cell first gate electrode coupling portion 11, the number of gate electrode coupling bars forming the gate-end second gate electrode coupling portion 12 may be a value other than one.

3. Explanation of Outline of First and Second Modified Examples of Gate Electrode Layout Corresponding to Semiconductor Device According to One Embodiment of the Invention in Present Application In this section, a modified example of the near-cell dam structure and the near-gate-end dam structure described in section 2 will be described below. A description will be given of the near-cell dam structure, and thus can also be applied to the near-gate-end dam structure.

Figure 3:
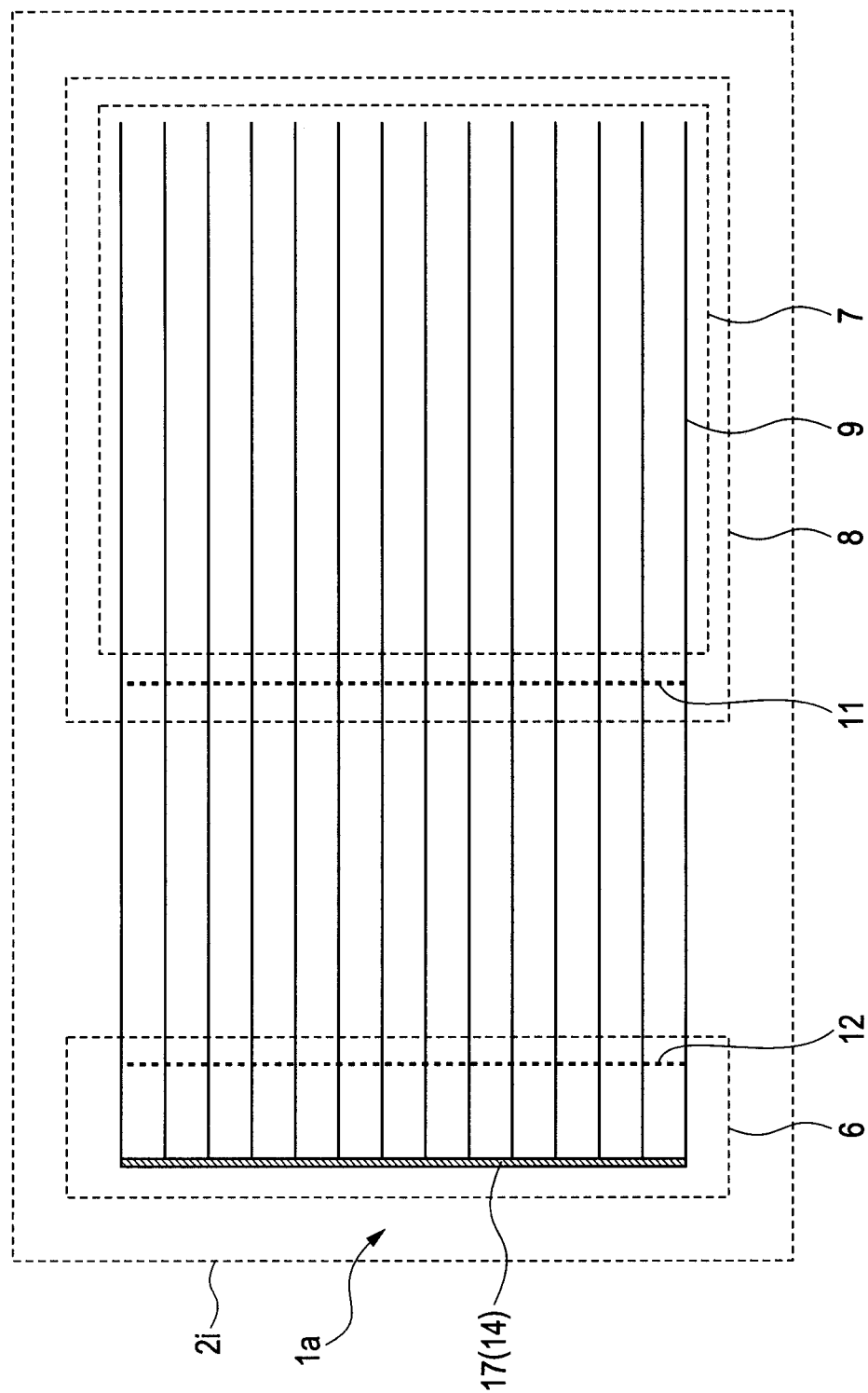
FIG. 3 is an extensive plan view of an inner region at an upper surface of a chip for explaining a first modified example (single coupling bar) of the gate electrode layout shown in FIG. 2.
Figure 4:
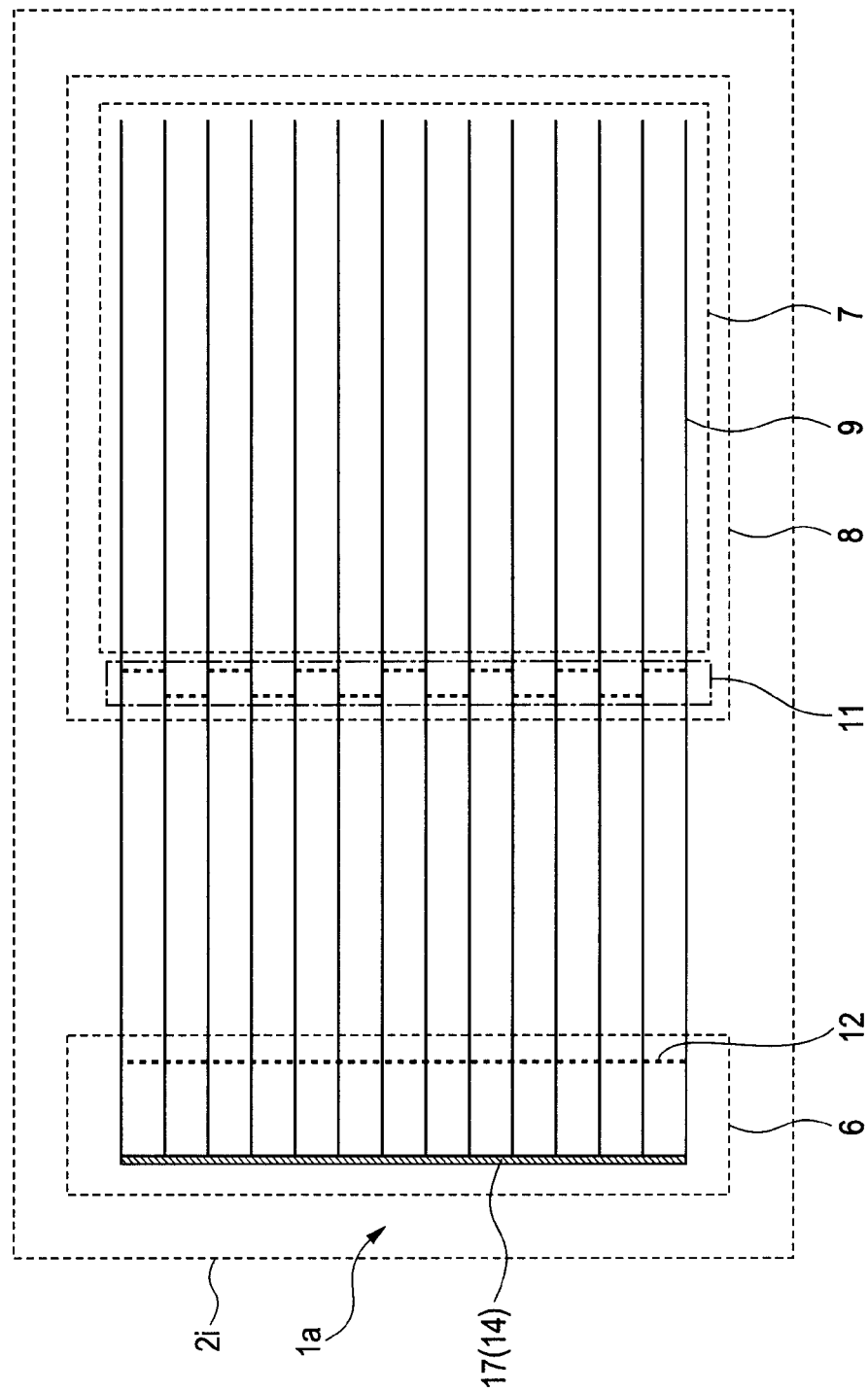
FIG. 4 is an extensive plan view of an inner region at an upper surface of a chip for explaining a second modified example (zig-zag coupling bar) of the gate electrode layout shown in FIG. 2.

FIG. 3 is an extensive plan view of an inner region at an upper surface of a chip for explaining the first modified example (single coupling bar) of the gate electrode layout shown in FIG. 2. FIG. 4 is an extensive plan view of an inner region at an upper surface of a chip for explaining the second modified example (zig-zag coupling bar) of the gate electrode layout shown in FIG. 2. Based on these figures, the outline of the first and second modified examples of the gate electrode layout corresponding to the semiconductor device according to the one embodiment in the present application will be described below.

FIG. 3 shows the first modified example. As shown in FIG. 3, in this example, the number of the near-cell gate electrode coupling bars forming the near-cell gate electrode coupling portion 11 is one. As the number of coupling bars becomes less, the distance between the outer edge of the active cell region 7 and the outer edge of the metal source electrode 8 can be lessened, so that an occupation area of the metal source electrode 8 is decreased.

In the second modified example as shown in FIG. 4, the near-cell gate electrode coupling portion 11 can be formed in the zig-zag structure and not as the linear near-cell gate electrode coupling bar.

4. Explanation of Device Structure of Power MOSFET

In this section, the device structure in the power MOSFET will be more specifically described as one example of the power semiconductor device of the embodiment. In this section, the following cross-sectional views are relatively exemplary ones. The more detailed description of processes to make such a device will be given below.

For convenience, an N-channel type device structure having an N-epitaxial layer formed as a drift region over an N-type silicon single crystal substrate will be explained below, but the invention of the present application is not limited thereto.

Now, a split gated vertical planar type power MOSFET which tends to generate voids in a metal electrode will be described below. However, the following description can also be applied to a power MOSFET having a liner gate structure, such as a normal vertical planar power MOSFET, or a trench gate power MOSFET, as well as an insulated gate bipolar transistor (IGBT) in the same way.

Figure 5:
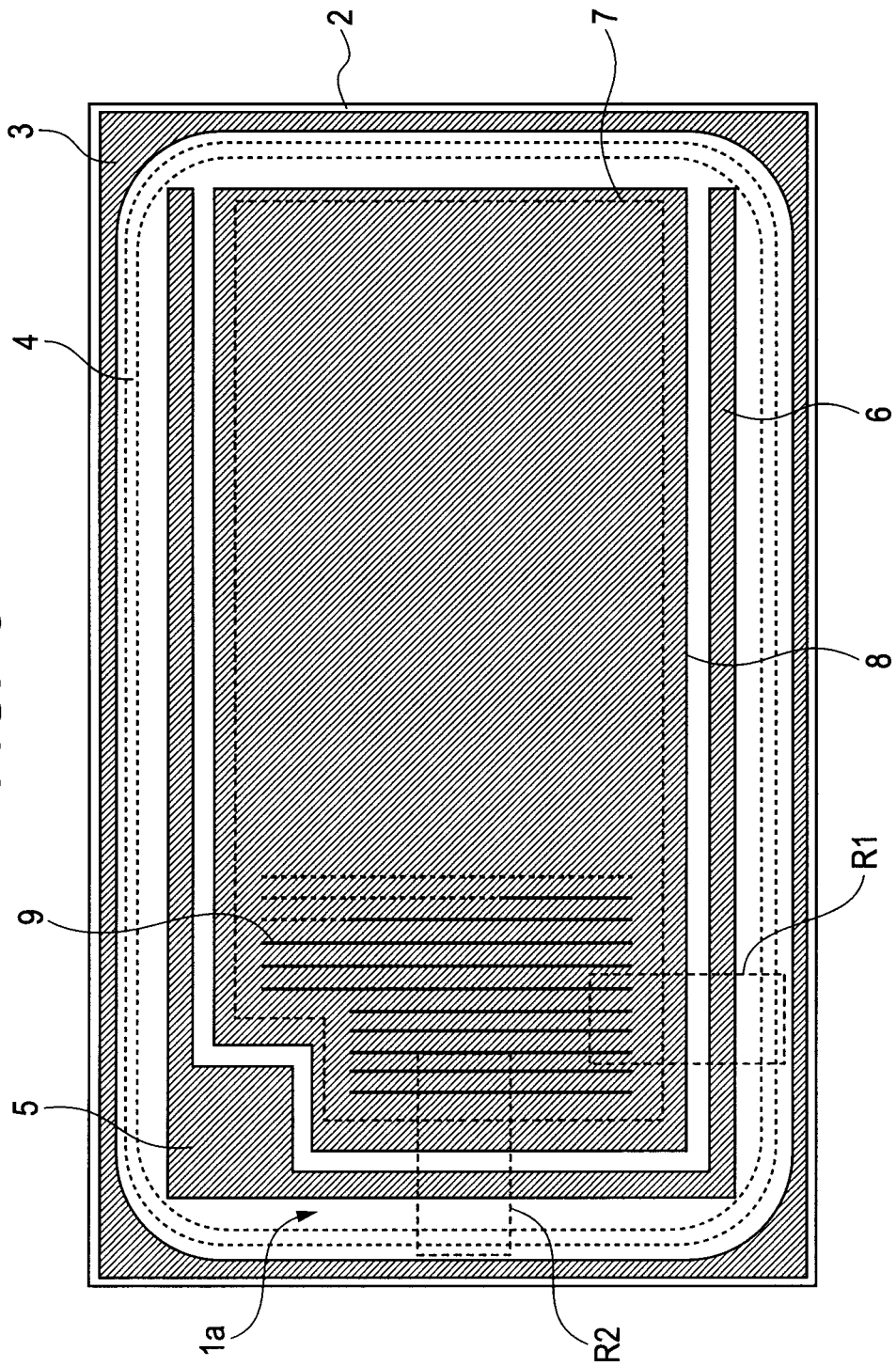
FIG. 5 is a front view of an entire chip for explaining a specific planar structure of a power MOSFET device, which is one example of the power semiconductor device according to the one embodiment of the invention in the present application.
Figure 6:
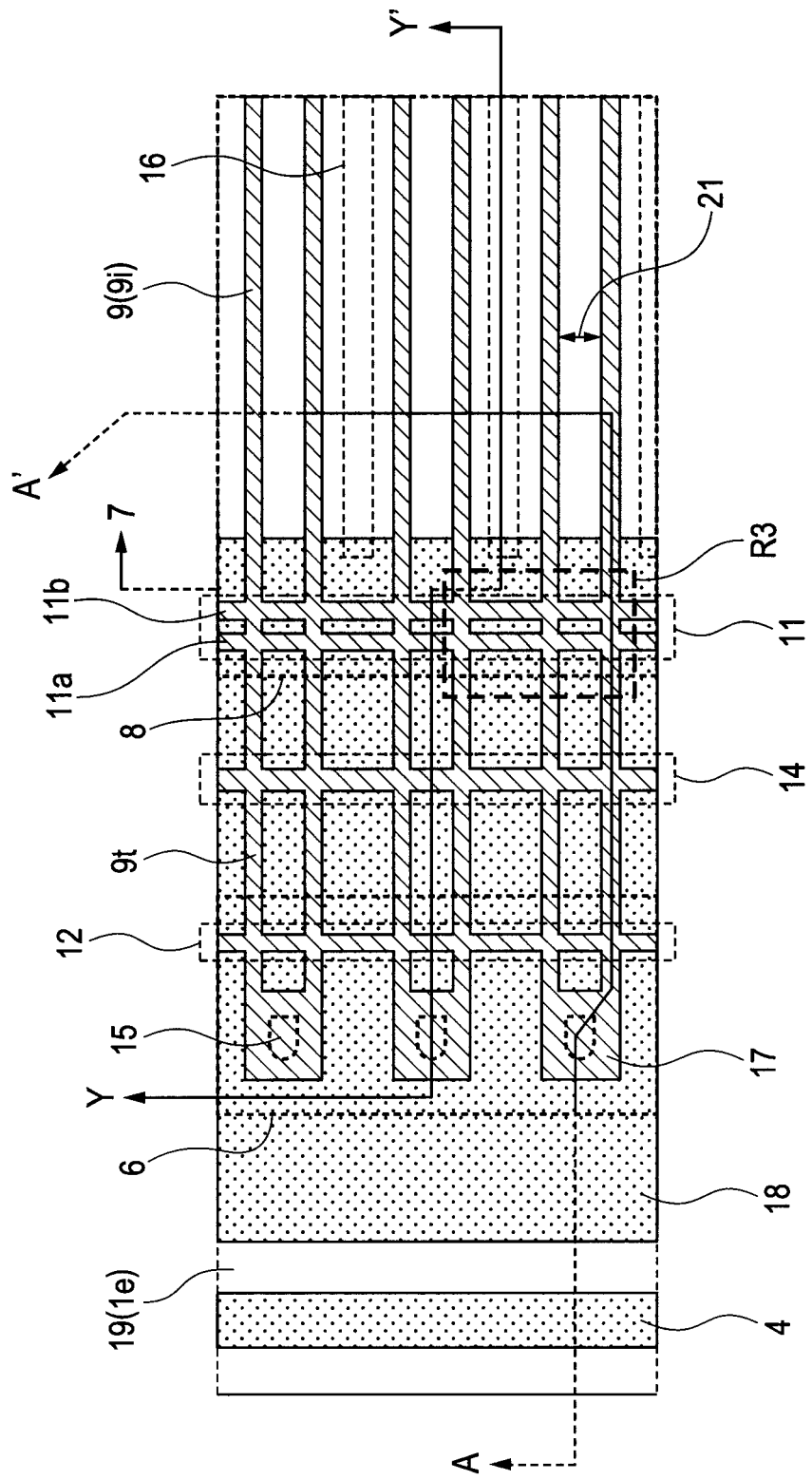
FIG. 6 is a front view of a part of the chip showing the details of the layout of a cut portion R1 in the protruding direction of the gate electrode shown in FIG. 5.
Figure 7:
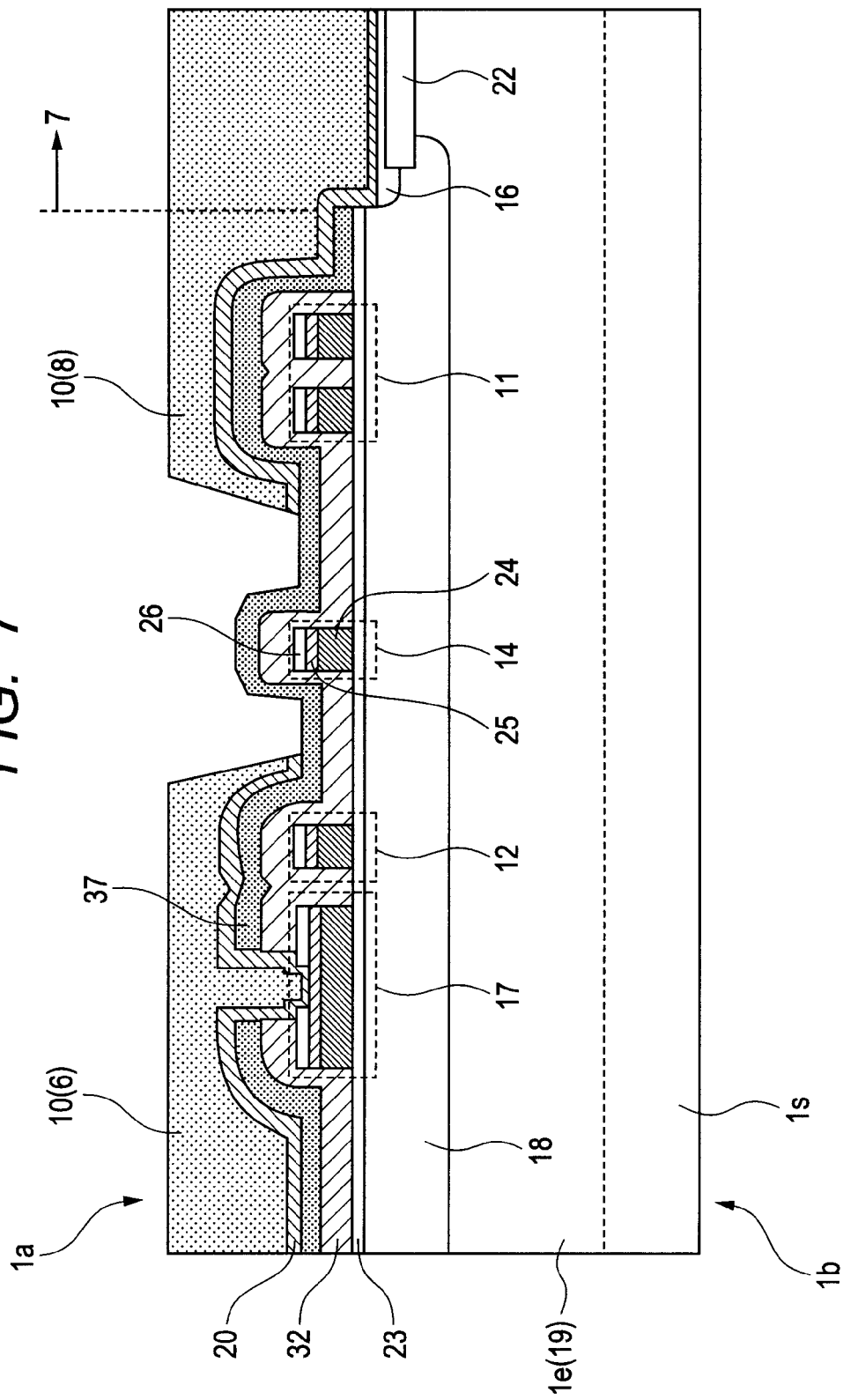
FIG. 7 is an exemplary cross-sectional view of the device taken along the line Y-Y' of FIG. 6.
Figure 8:
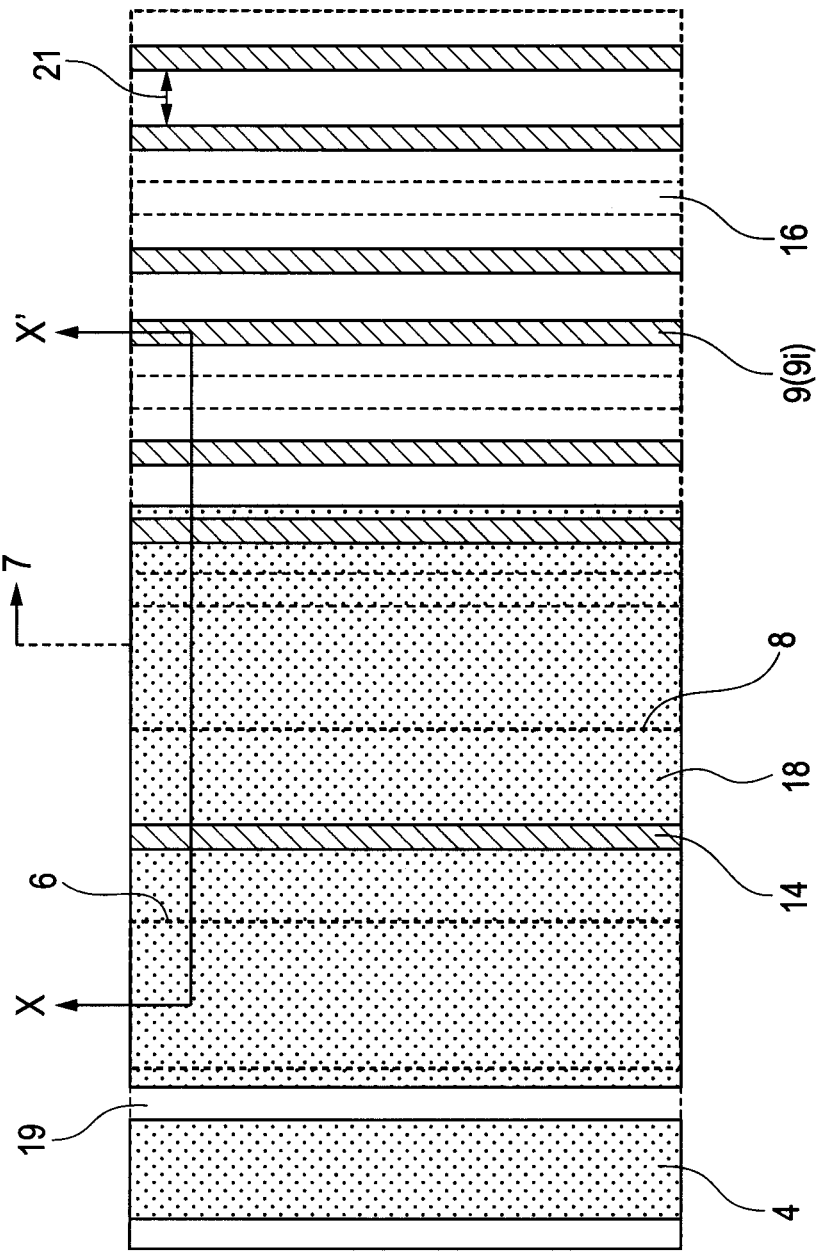
FIG. 8 is a front view of a part of the chip showing the details of the layout of a cut portion R2 of the side of the gate electrode shown in FIG. 5.
Figure 9:
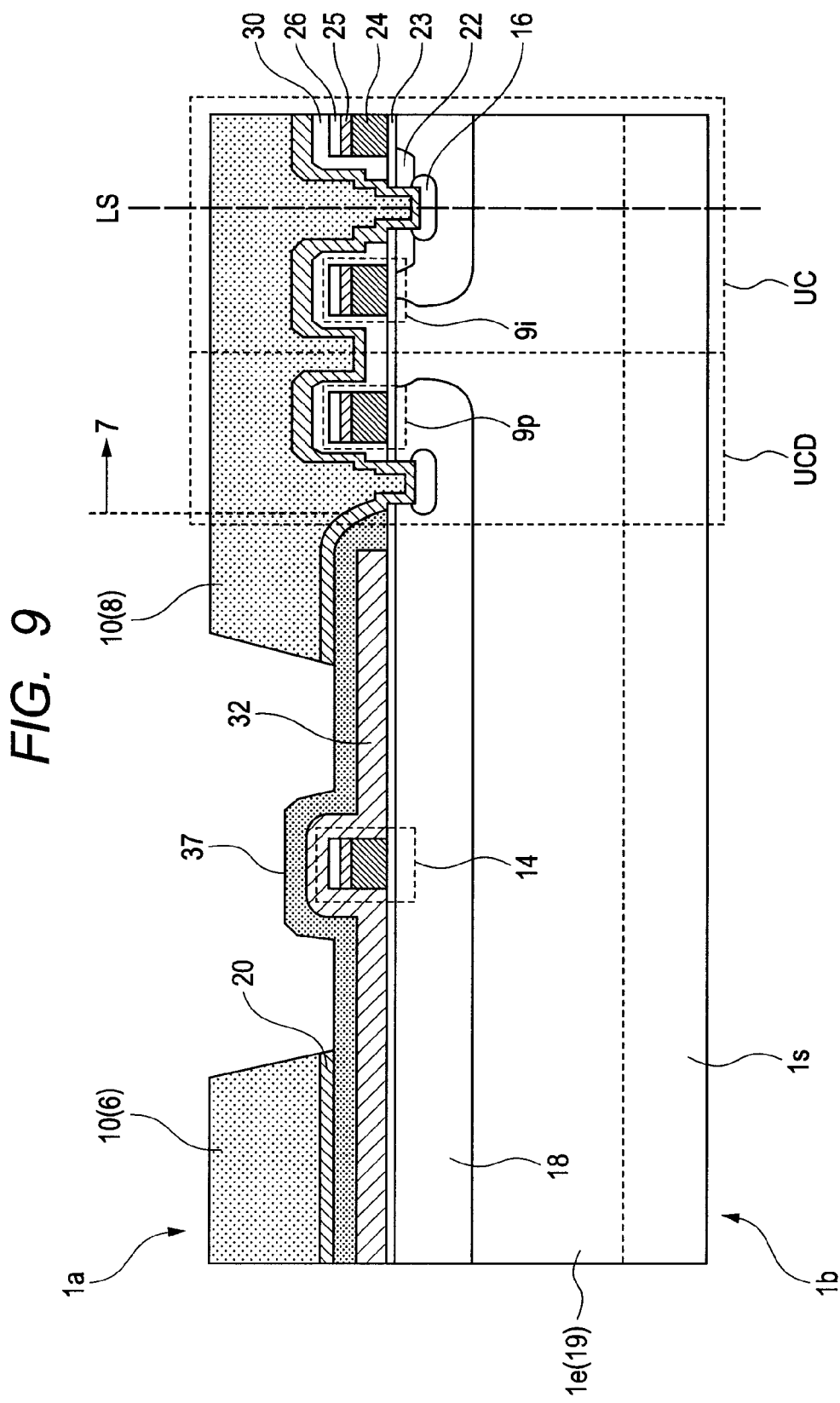
FIG. 9 is an exemplary cross-sectional view of the device taken along the line X-X' of FIG. 8.

FIG. 5 is a front view of an entire chip for explaining a specific planar structure of a power MOSFET device, which is one example of the power semiconductor device according to one embodiment of the invention in the present application. FIG. 6 is a front view of a part of the chip, showing the details of the layout of a cut portion R1 of a gate electrode in the protruding direction of the electrode shown in FIG. 5. FIG. 7 is an exemplary cross-sectional view of the device taken along the line Y-Y' of FIG. 6. FIG. 8 is a front view of a part of the chip showing the details of the layout of a cut portion R2 of the gate electrode shown in FIG. 5. FIG. 9 is an exemplary cross-sectional view of the device taken along the line X-X' of FIG. 8. Based on these figures, the device structure of the power MOSFET will be described below.

As shown in FIG. 5, a guard ring 3 (for example, comprised of a barrier metal film as a lower layer, and an aluminum metal electrode film as an upper layer) is provided at the outer end of the upper surface 1a of the power MOSFET chip 2. Inside the guard ring, a field limiting ring 4 or a floating field ring is provided. For example, an upper layer gate wiring 6 having a substantially U shape (for example, comprised of a barrier metal film as a lower layer, and an aluminum metal electrode film as an upper layer) is provided inside the field limiting ring 4. A part of the upper layer gate wiring 6 serves as a gate pad 5.

The active cell region 7 occupying a relatively large area is further provided inside the field limiting ring 4 and the upper layer gate wiring 6. For example, the active cell region 7 is provided with a number of linear gate electrodes 9 disposed in parallel, and having a repeated structure. At least one end of the gate electrode 9 extends under the upper layer gate wiring 6. This figure (see FIG. 5) shows only a part of the so-called intrinsic gate electrode (if all of the gate electrodes were to be illustrated, the number of the gate electrodes will be within a range of several hundred to several thousand or more, which will make it difficult to understand the figure). The metal source electrode 8 (for example, comprised of a barrier metal film as a lower layer, and an aluminum metal electrode film as an upper layer) generally covers the entire active cell region 7, and extends beyond the entire periphery of the active cell region 7 to cover its surroundings.

FIG. 6 shows the details of a cut portion R1 in the direction of protrusion of the gate electrodes shown in FIG. 5. As shown in FIG. 6, at the left end, a P-type field limiting ring 4 is positioned, while on the right side, a P-type ring region 18 is provided to surround the active cell region 7 with an N-type drift region 19 (N-epitaxial layer 1e) sandwiched between the P-type field-limiting ring 4 and the P-type ring region 18.

The gate electrodes 9 extend in a linear manner along a first direction, each gate electrode comprising an intrinsic portion 9i ("first portion") found in the active cell region 7 and a lead portion 9t ("second portion") found in the non-cell region and connecting to the intrinsic portion 9i. Each gate electrode 9, or more particularly its lead portion 9t, terminates in a gate electrode end 17 in the non-cell region. Within the non-cell region, and extending along a second direction transverse to the first direction, are a near-cell first gate electrode coupling portion 11, a gate-end second gate electrode coupling portion 12, and the lower layer gate wiring 14. As seen in the front view of, e.g., FIG. 6, the gate electrode coupling portions 11, 12 and the lower layer gate wiring 14 all extend perpendicular to the gate electrodes 9, and are adapted to couple the lead portions 9 of the gate electrodes 9 in the non-cell region. As best seen in FIG. 6, the gate electrodes' intrinsic and lead portions 9i, 9t, the first and second gate electrode coupling portions 11 and 12, and the lower layer gate wiring 14 may comprise an integrally formed multi-layer structure, the various portions being formed at the same time, having the same material layers and occupying a same depth in the finished device.

A coupling portion 15 between the gate electrode and the gate metal is provided at the center of the gate electrode end 17 to establish coupling with the upper layer gate wiring 6. As mentioned above, the near-cell gate electrode coupling portion 11 and the gate-end gate electrode coupling portion 12 are covered with the metal source electrode 8 and the upper layer gate wiring 6, respectively. Gate split regions 21 and $P^+$-type body contact regions 16 are alternatingly provided between the gate electrodes 9 in the active cell region 7.

An example of the dimension of respective components shown in FIG. 6 will be as follows. That is, the width of each of the intrinsic gate electrode 9i and the gate electrode lead portion 9t is, for example, about 0.5 micrometers. Each of a distance between the gate electrode coupling bars 11a and 11b located close to each other, and a distance between an inner end of the near-cell gate electrode coupling portion 11 (active cell side of the gate electrode coupling bar 11b) and the active cell 7 is in a range of about 0.5 to 2 micrometers. A distance between the gate electrodes (a pair of gate electrodes opposed to each other between split gates with the $P^+$-type body contact region 16 sandwiched therebetween) is, for example, substantially in a range of 1.1 to 1.5 micrometers.

FIG. 7 shows a device structure corresponding to the cross-section taken along the line Y-Y' of FIG. 6. As shown in FIG. 7, the power MOSFET has a main structure formed on an upper surface 1a side of the N-epitaxial layer 1e (N-type drift region 19) over the N-type silicon single crystal substrate 1s having a lower surface 1b. The P-type ring region 18 around the active cell region, the $P^+$-type body contact region 16, the N-type source region 22, and the like are provided at a superficial surface region of the N-epitaxial layer 1e.

The gate electrode structure 9, that is, the near-cell gate electrode coupling portion 11, the gate-end gate electrode coupling portion 12, the lower layer gate wiring 14, and the gate electrode end 17 are provided over the P-type ring region 18 around the active cell region via a gate insulating film 23 (or an insulating film formed at the same time as the gate insulating film). Such a gate electrode structure is covered with a second insulating film 32 for forming sidewalls and an interlayer insulating film 37. The interlayer insulating film 37 is partially covered with the barrier metal film 20 (for example, TiW film) and the aluminum metal electrode film 10 (containing aluminum as a principal component, and several percentage (%) or less of an additive). The interlayer insulating film 37, the barrier metal film 20 and the aluminum metal electrode film 10 together form the metal source electrode 8 ("first metal electrode") and the upper layer gate wiring 6 (or gate pad 5). As best seen in FIGS. 6 and 7, the first metal electrode 8 overlies the first portions 9i of the gate electrodes 9 and also overlies the first gate electrode coupling portion 11 (coupling bars 11a, 11b), but does not overlie the gate electrode ends 17 or the lower layer gate wiring 14.

The gate electrode 9 (gate electrode structure) forms an integral laminated structure. In this case, the gate electrode 9 is comprised of, for example, a polysilicon film 24 as a lower layer, a silicide film 25 made of an intermediate layer WSi film or the like, and a silicon oxide cap film 26 as the upper layer or the like.

FIG. 8 shows an enlarged plan view of a cut portion R2 of the side of the gate electrode shown in FIG. 5. As shown in FIG. 8, the P-type field limiting ring 4 is positioned at the leftmost side, and the P-type ring region 18 around the active cell is provided on the right side with the N-type drift region 19 sandwiched between the ring 4 and the region 18. The active cell region 7 is positioned inside the vicinity of the inner end of the P-type ring region 18 around the active cell region. The substantially linear gate electrodes 9 (intrinsic gate electrodes 9i) are provided at substantially equal intervals (in this case, exactly, at completely equal intervals). The $P^+$-type body contact regions 16 and the gate split regions 21 are alternatingly provided between the intrinsic gate electrodes 9i. The lower layer gate wiring 14 is provided over the P-type ring region 18 around the active cell region via the gate insulating film 23 (see FIG. 7). Further, the upper layer gate wiring 6 (comprised of the barrier metal film 20 as the lower layer and the aluminum metal electrode film 10 as the upper layer) is provided above the P-type ring region 18 around the active cell region 7 at the outer periphery (left side shown in FIG. 8) of the lower layer gate wiring 14. The metal source electrode 8 extends beyond, and surrounds, the active cell region 7 in the same way as seen FIG. 5 or FIG. 6.

FIG. 9 shows the cross-section taken along the line X-X' of FIG. 8. As shown in FIG. 9, the power MOSFET has a main structure formed on the upper surface 1a side of the N-epitaxial layer 1e (N-type drift region 19) over the N-type silicon single crystal substrate 1s. The P-type ring region 18 around the active cell region, the $P^+$-type body contact region 16, the N-type source region 22, and the like are provided at a superficial surface region of the N-epitaxial layer 1e.

The gate electrode structure 9, that is, the intrinsic gate electrode 9i, the gate electrode 9p at the end of the active cell region (a dummy structure or an edge termination structure not operating as a MOSFET), and a lower layer gate wiring 14 are provided at the P-type ring region 18 around the active cell region via a gate insulating film 23 (or an insulating film formed at the same time as the gate insulating film). Such a gate electrode structure is covered with the second insulating film 32 for forming sidewalls and the interlayer insulating film 37 (note that such a multilayered insulating film inside the active region 7 is collectively referred to as an inside-active region gate-electrode peripheral insulating film 30). The interlayer insulating film 37 is partially covered with the barrier metal film 20 (for example, TiW film) and the aluminum metal electrode film 10 (containing aluminum as a principal component, and several percentage (%) or less of an additive). The interlayer insulating film 37, the barrier metal film 20 and the aluminum metal electrode film 10 together form the metal source electrode 8 and the upper layer gate wiring 6 (or gate pad 5).

The gate electrode 9p near the end of the active cell region forms the so-called dummy cell UCD. On the other hand, the unit cell UC forming the main part of the active cell region 7 has a symmetric structure with respect to a symmetry plane corresponding to a unit cell center line LS. The unit cell UC is repeated hundreds to thousands times.

5. Additional Explanation about Width of Gate Electrode or the Like of Power MOSFET In this section, the interrelation on width between respective parts of the gate electrode structure described above will be described below.

Figure 10:
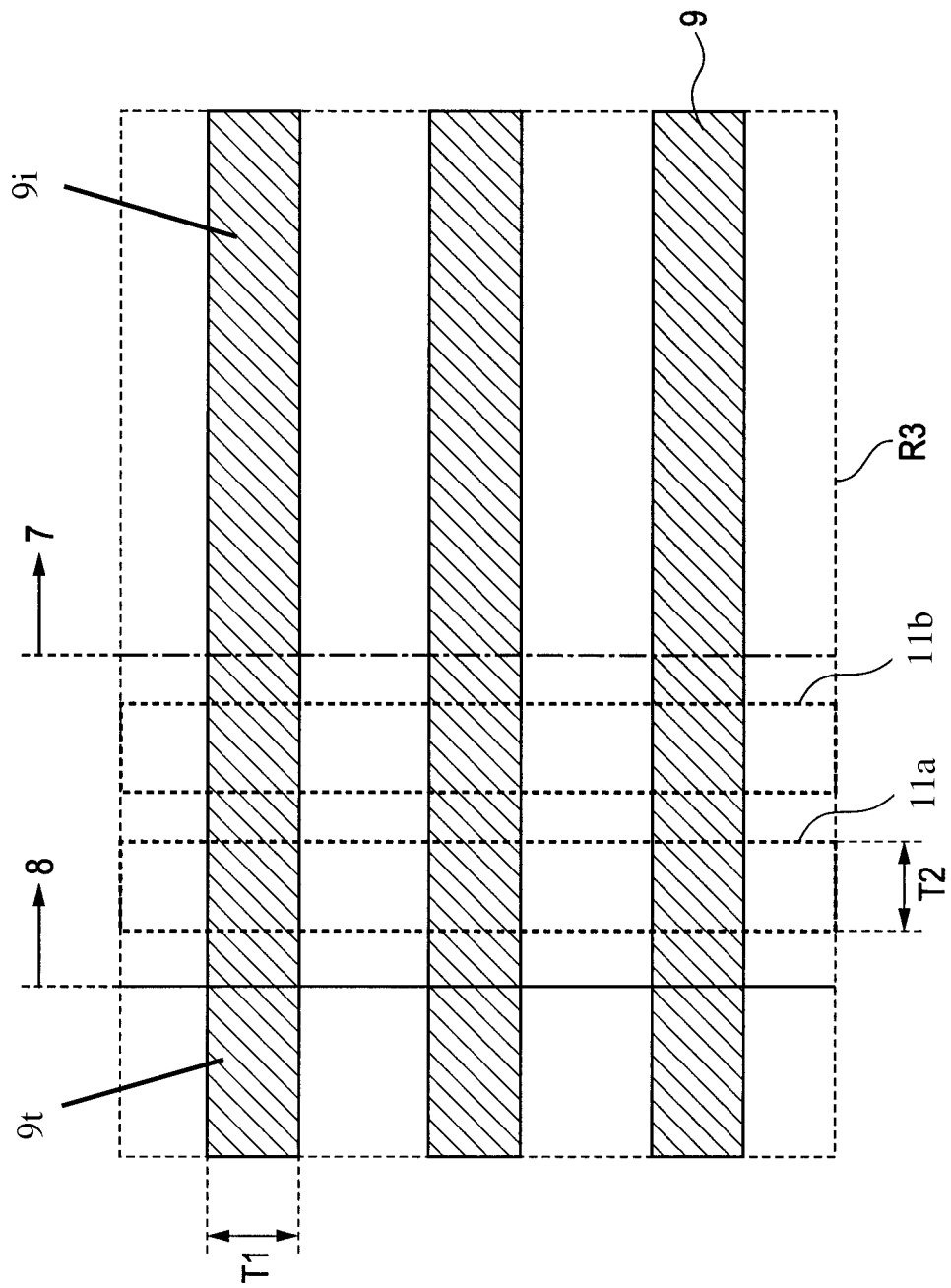
FIG. 10 is a local front view of a chip showing a basic layout of a cut portion R3 around the gate electrode coupling portion near the cell shown in FIG. 6.
Figure 11:
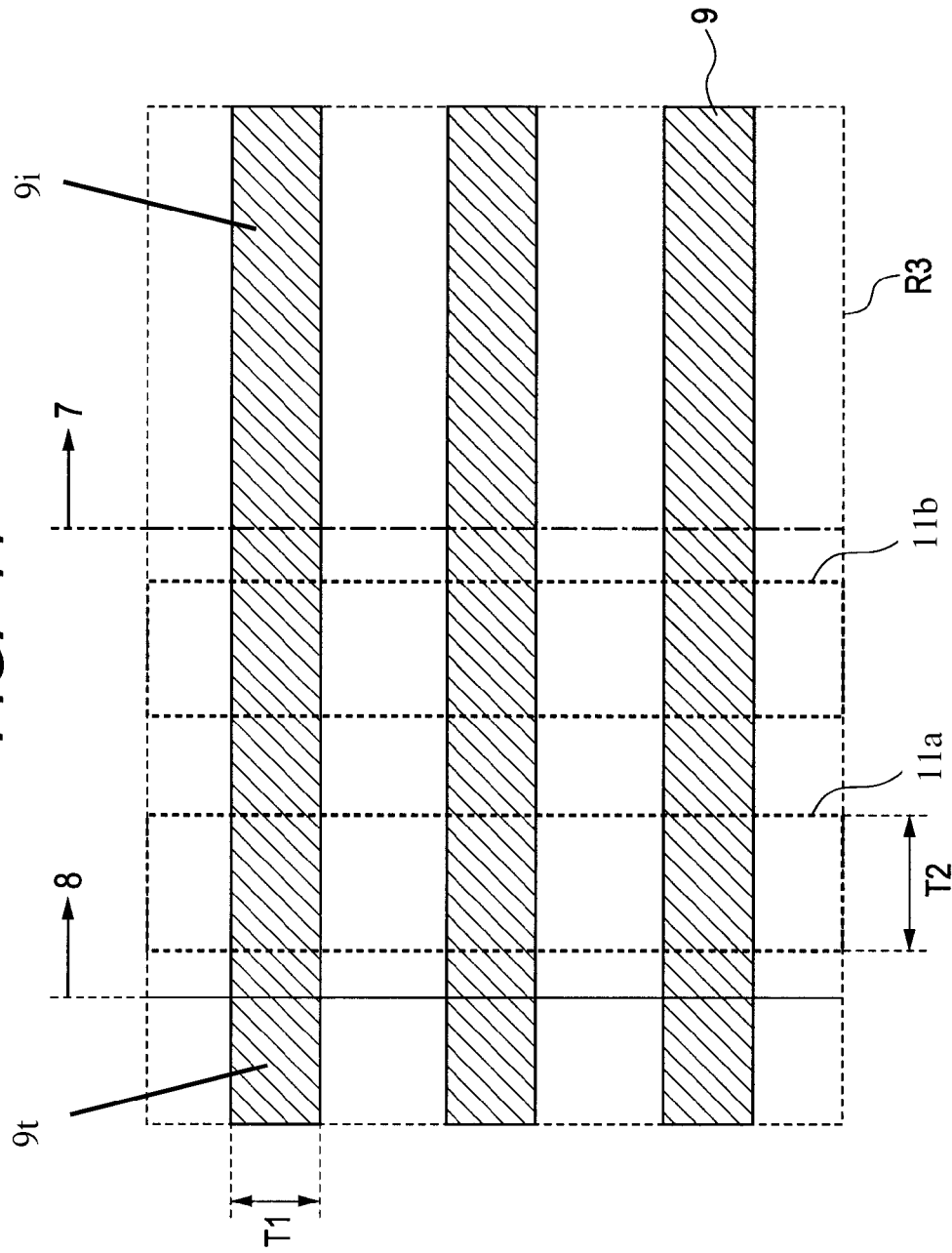
FIG. 11 is a local front view of a chip showing a layout corresponding to a modified example regarding the dimension of a cut portion R3 around the gate electrode coupling portion near the cell shown in FIG. 6.

FIG. 10 is a local front view of a chip showing a basic layout of a cut portion R3 around the gate electrode coupling portion near the cell shown in FIG. 6. FIG. 11 is a local front view of a chip showing a layout corresponding to a modified example regarding the dimension of the cut portion R3 around the near-cell gate electrode coupling portion shown in FIG. 6. Based on these figures, additional description will be given about the width of the gate electrode or the like in the power MOSFET.

As shown in FIG. 10, in the gate electrode of the power MOSFET, the first width T1 of the gate electrode lead portion 9t is normally the same as the width T1 of the intrinsic gate electrode 9i. In the example seen in FIG. 10, the second width T2 of the near-cell gate electrode coupling portion 11 (that is, the width of a part other than the gate electrode lead portion 9t and the intrinsic gate electrode 9i in the gate electrode structure), more accurately, the width of each of the near-cell gate electrode coupling bars 11a and 11b forming the transversely extending near-cell gate electrode coupling portion 11 is substantially equal to the first width T1. The same goes for the gate-end gate electrode coupling portion 12, the lower layer gate wiring 14, and the like. Thus, the widths of the respective components comprised of the same material layer are set to the substantially same value, which can facilitate the processing of the layer.

FIG. 11 shows a modified example corresponding to FIG. 10. As shown in FIG. 11, the modified example satisfies the following equation: width T2>width T1. In other words, the first width T1 of the gate electrodes is smaller that the second width of the gate electrode coupling bars 11a, 11b. By this arrangement, the dam effect of the etching is improved. On the other hand, a distance between the end of the active cell region 7 and the end of the metal source electrode 8 is disadvantageously increased. The easiness of processing in FIG. 10 is better than that in FIG. 11.

6. Explanation of Main Parts of Wafer Processing to from Power MOSFET

This section will specifically describe an example of the MOSFET having a source/drain breakdown voltage of about several tens volts, or less. A manufacturing process of a general planar vertical MOSFET involves producing an edge termination structure, such as a field plate. In the planar type vertical MOSFET, a relatively thick field insulating film is provided under a gate electrode. In contrast, in order to simplify the process, the following process does not form an insulating film thicker than a gate oxide film under such a gate electrode (which is hereinafter referred to as a "non-field insulating film structure"). However, it is needless to say that the invention of the present application is not limited to such a non-field insulating film structure. It is noted that because of such a structure, the gate lead portion disadvantageously has to be comprised of an integral laminated structure without any opening so as to reduce unnecessary gate capacitance (note that the split gate structure is also based on the same reason).

Figure 12:
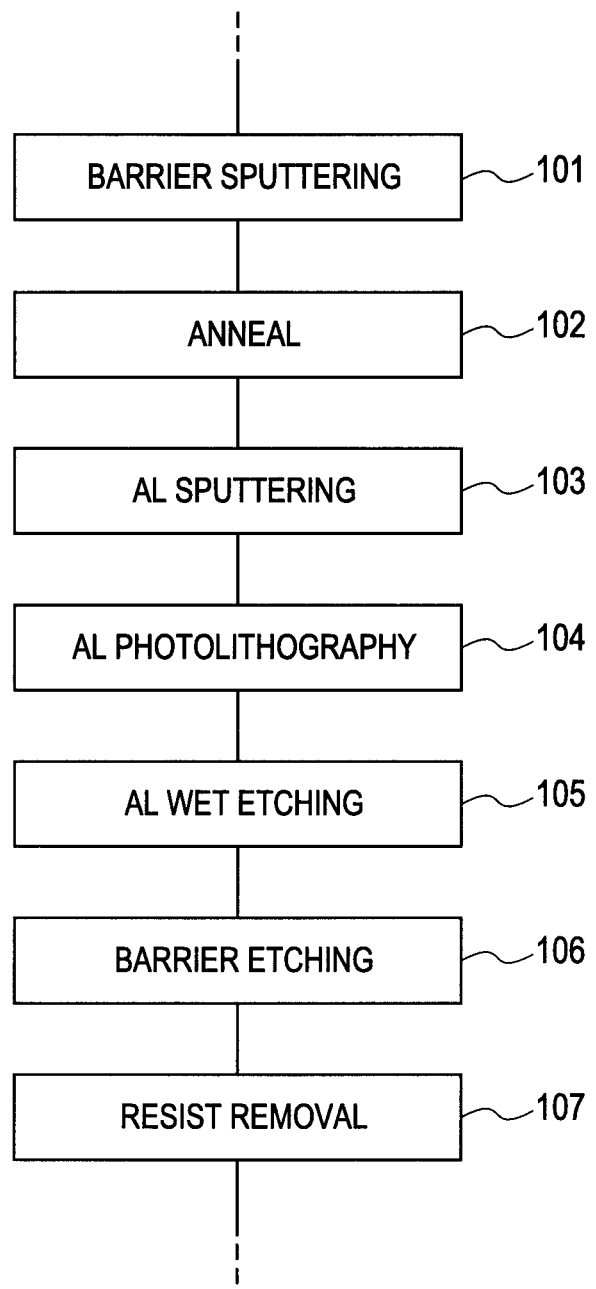
FIG. 12 is a process block flowchart for explaining a main part of a wafer process line of the power MOSFET which is one of the power semiconductor device according to the one embodiment of the invention in the present application.

FIG. 12 is a process block flowchart for explaining the main wafer processing steps to form the above-described power MOSFET. FIGS. 13-22 are device cross-sectional views, each substantially corresponding to the cross section taken along the line A-A' of FIG. 6, to show various intermediate stages in the formation of the power MOSFET.

Figure 13:
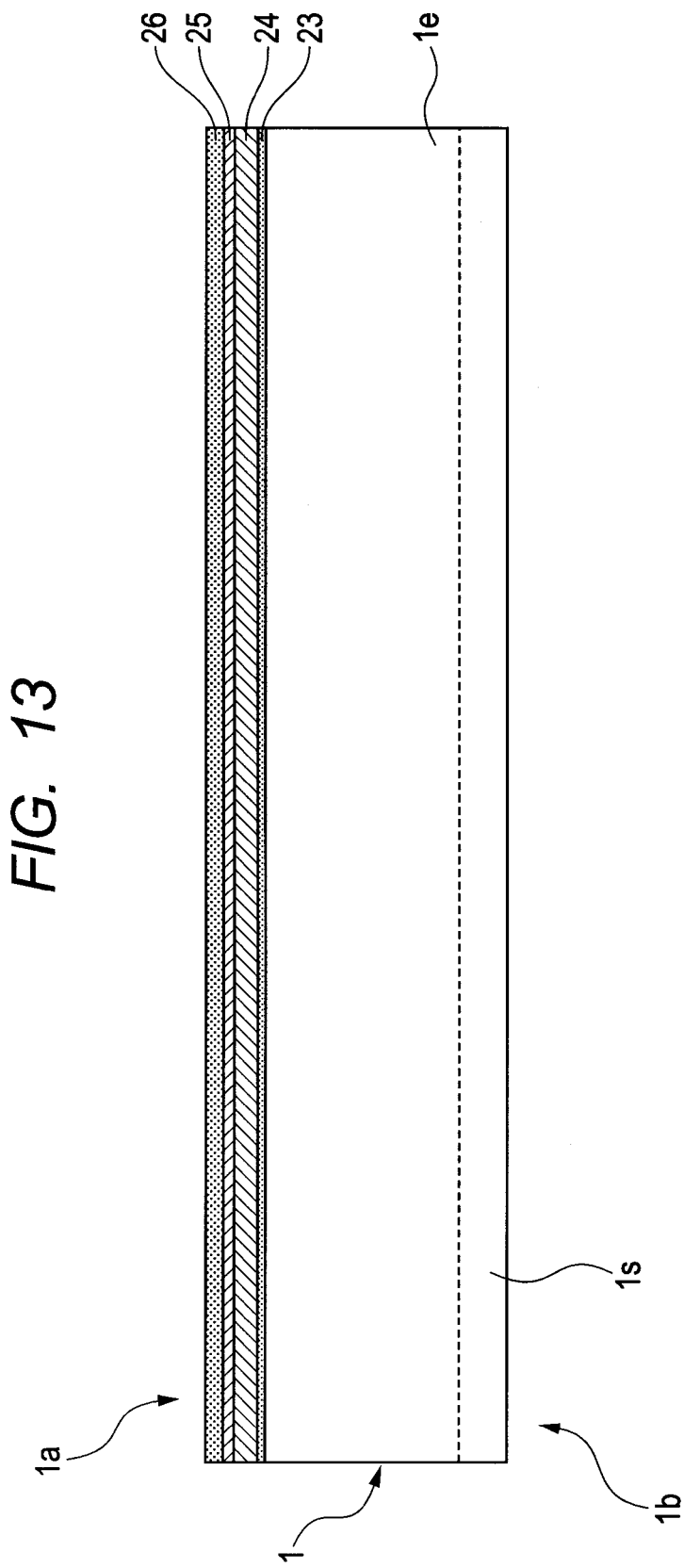
Figure 14:
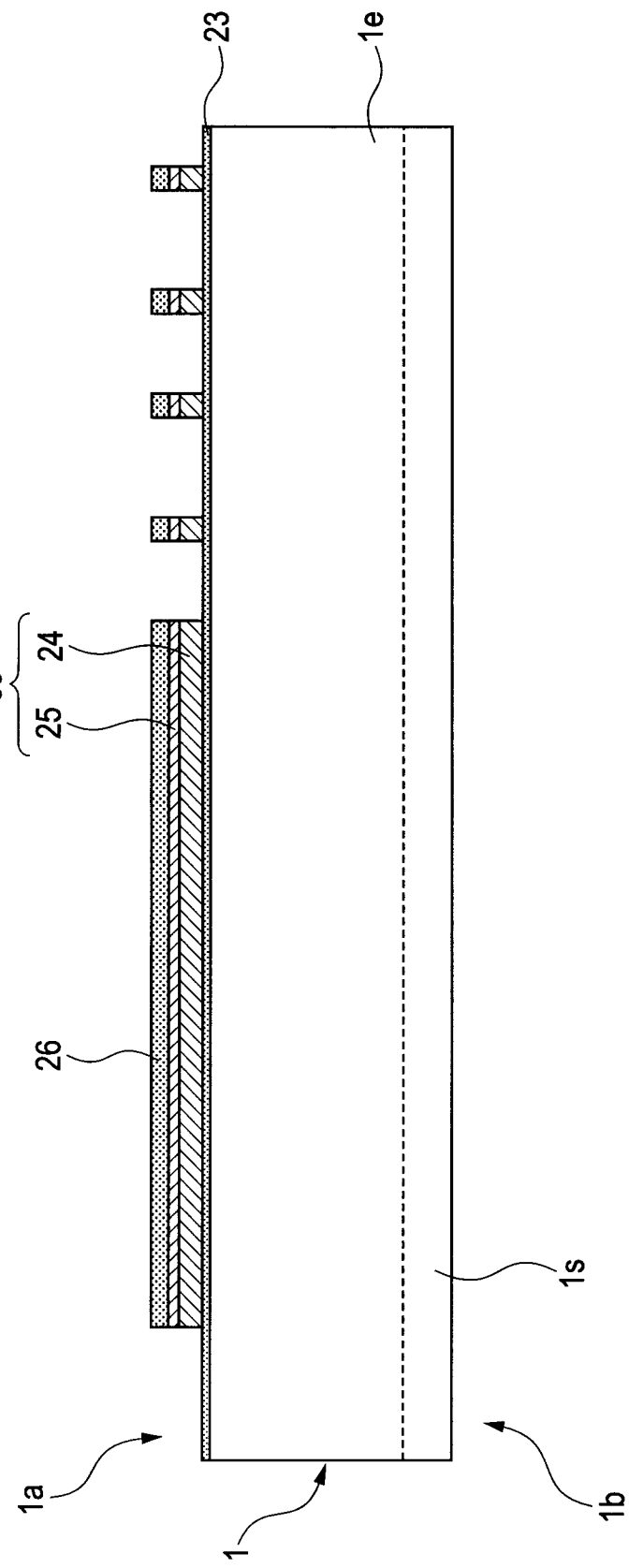
Figure 15:
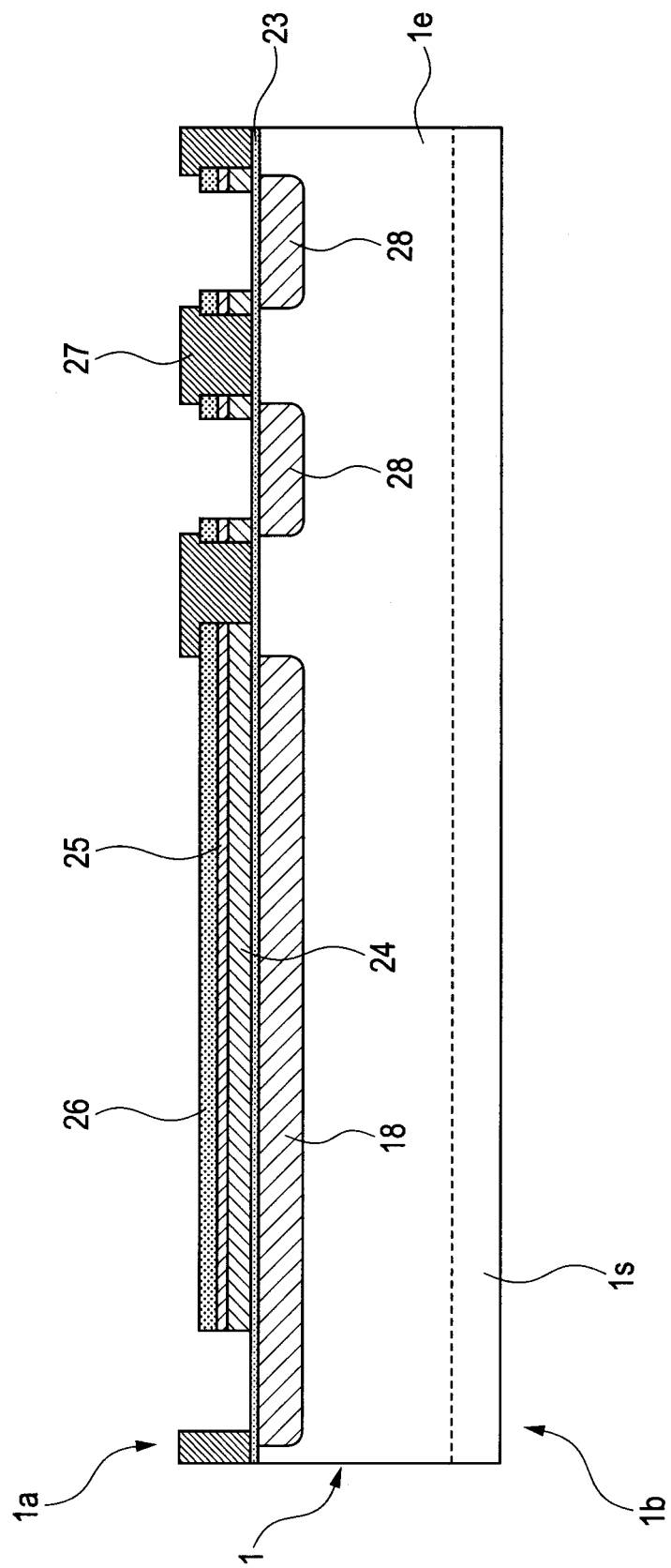
Figure 16:
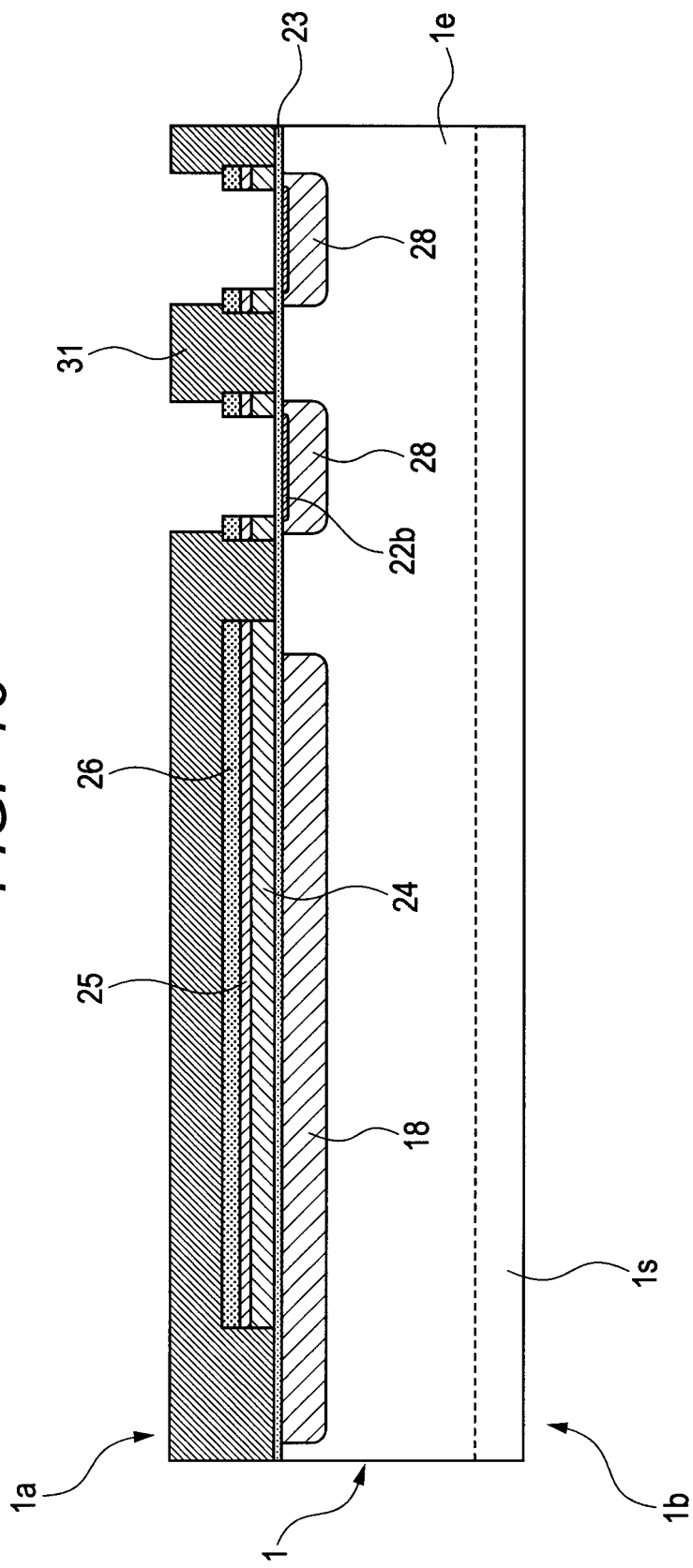
Figure 17:
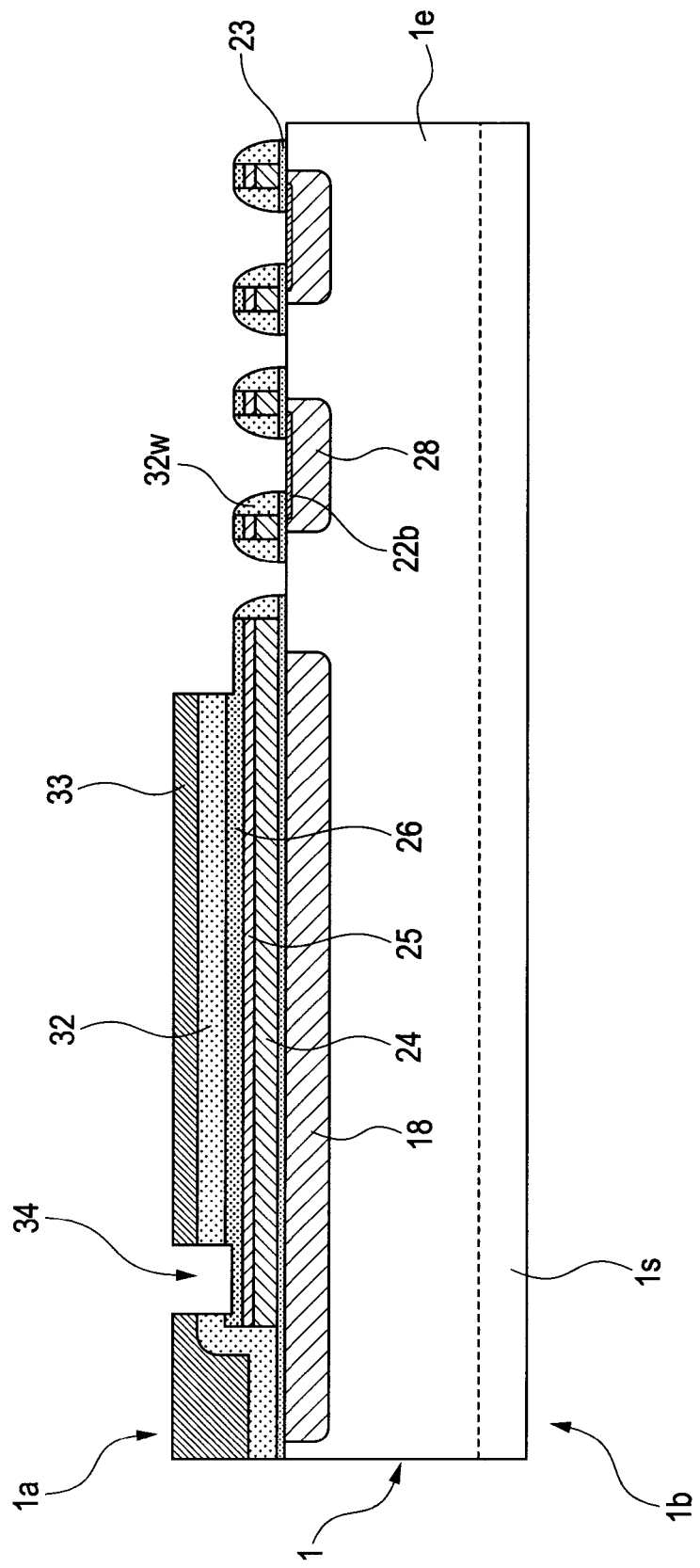
Figure 18:
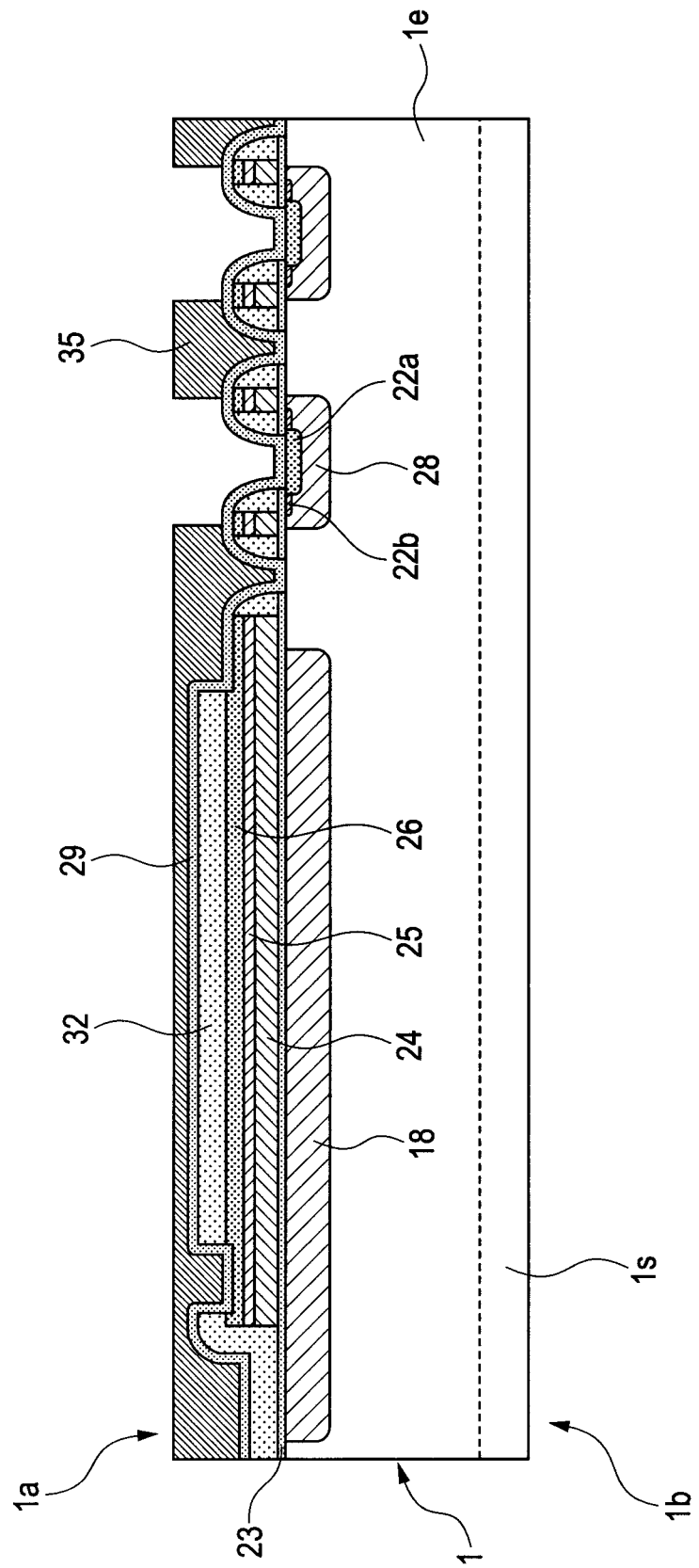
Figure 19:
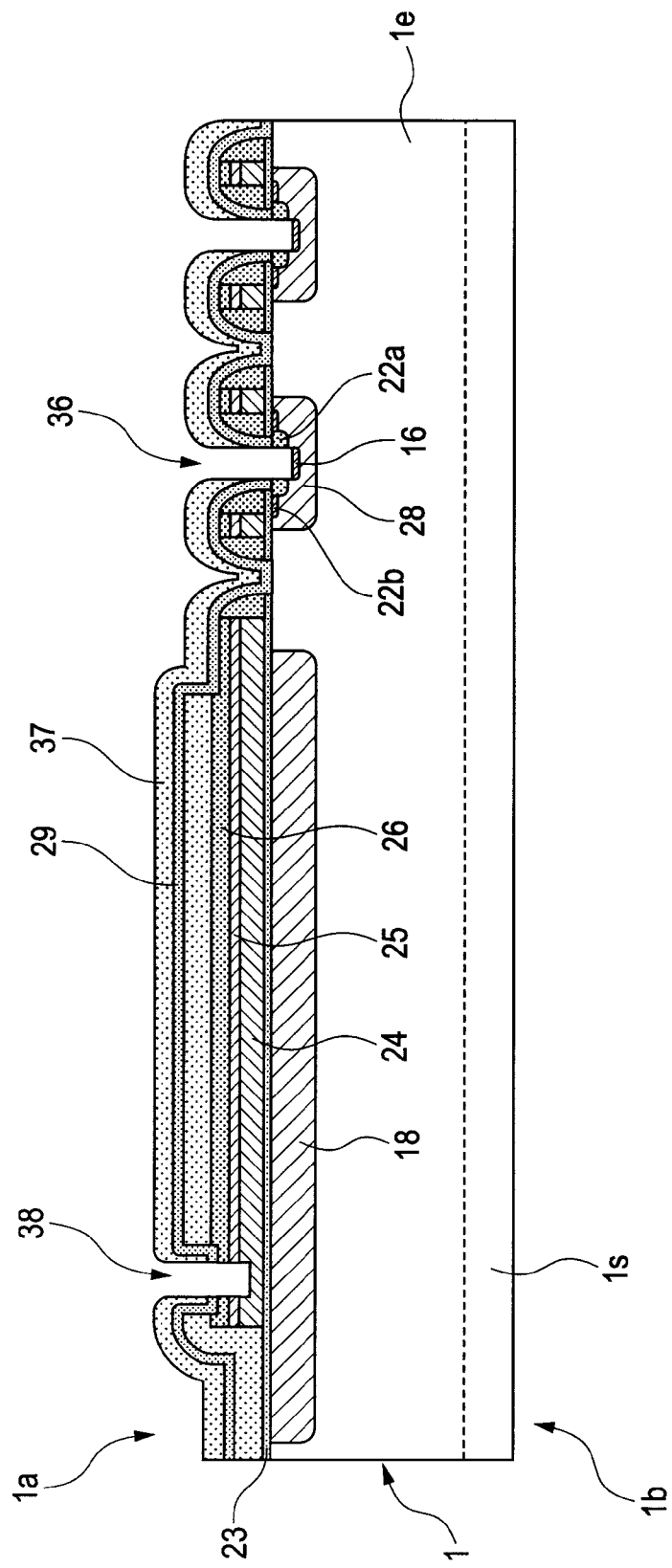
Figure 20:
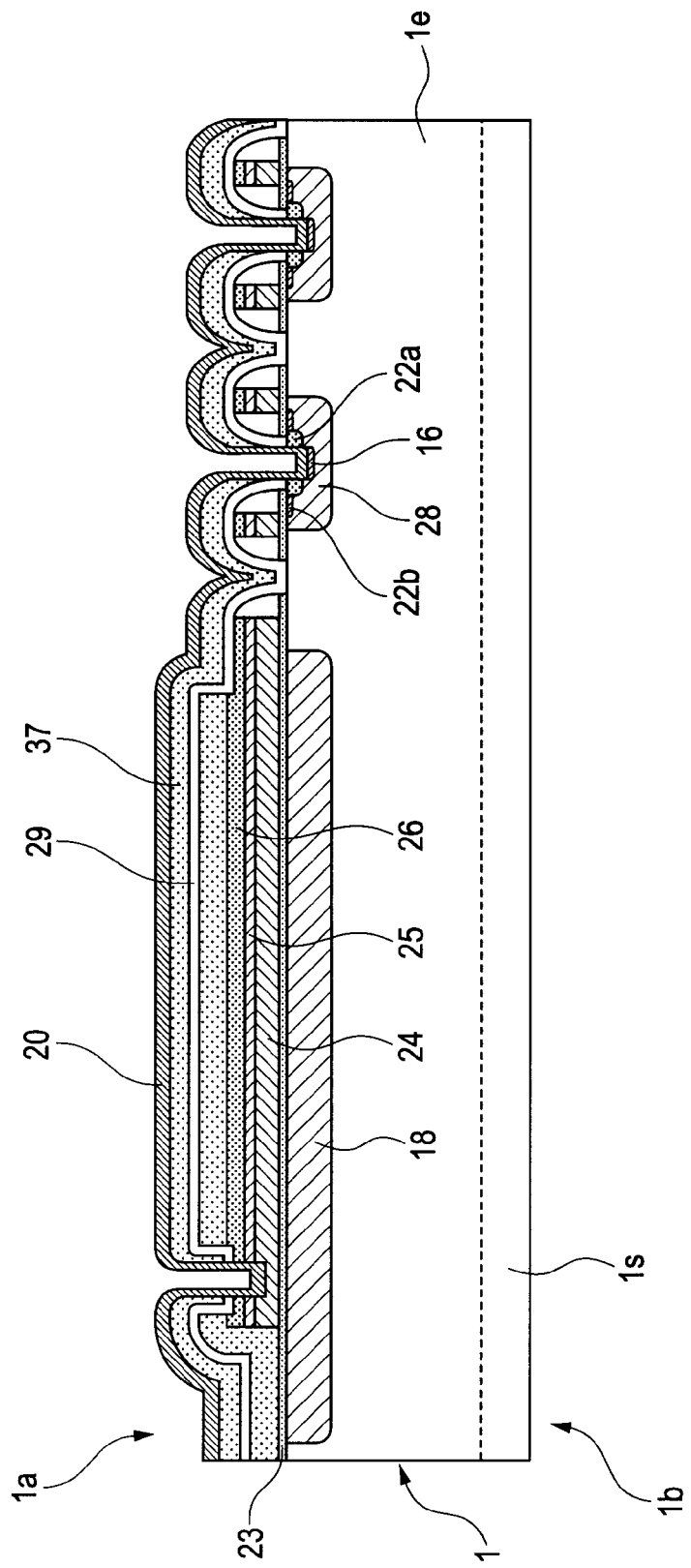
Figure 21:
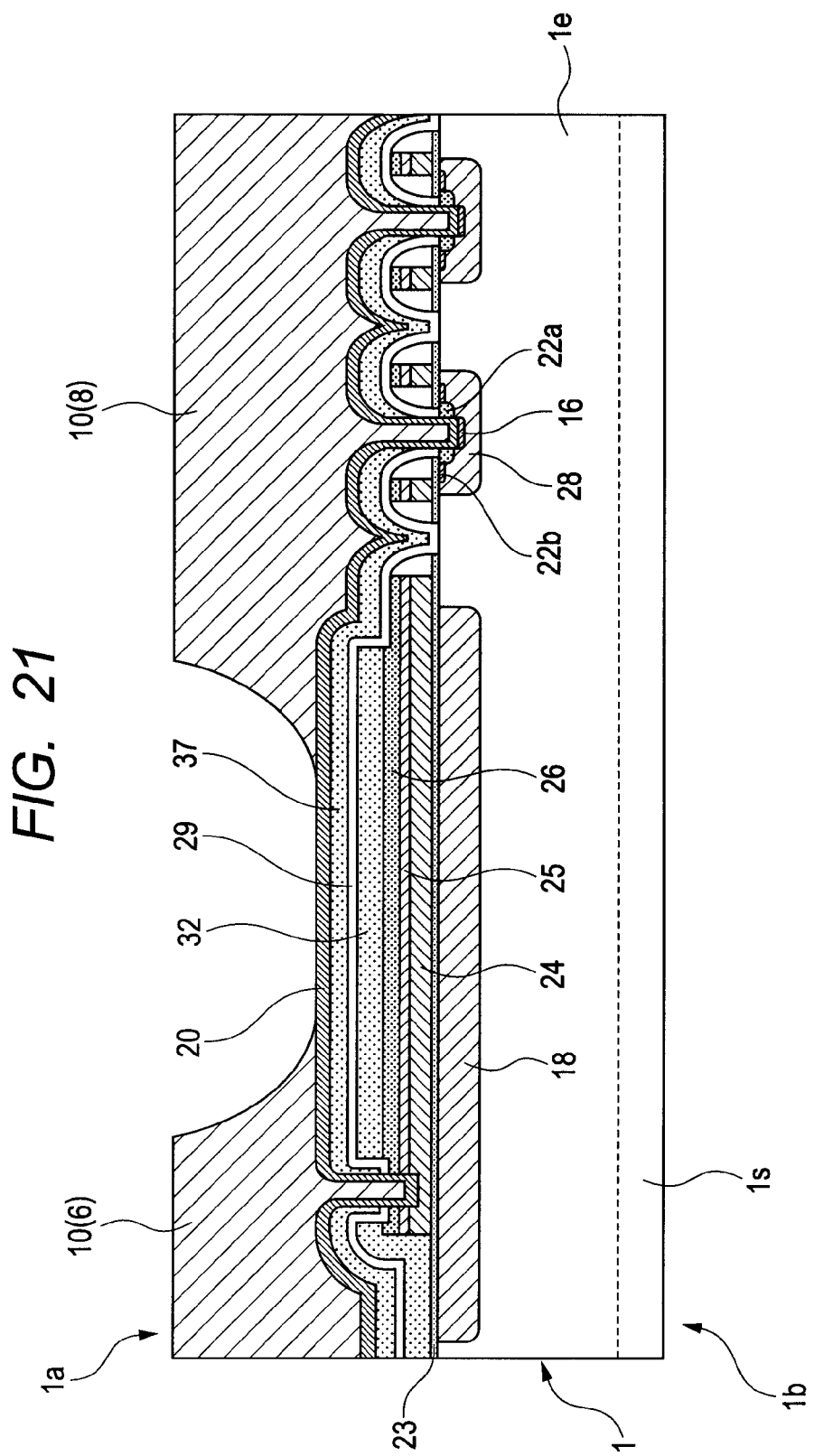
Figure 22:
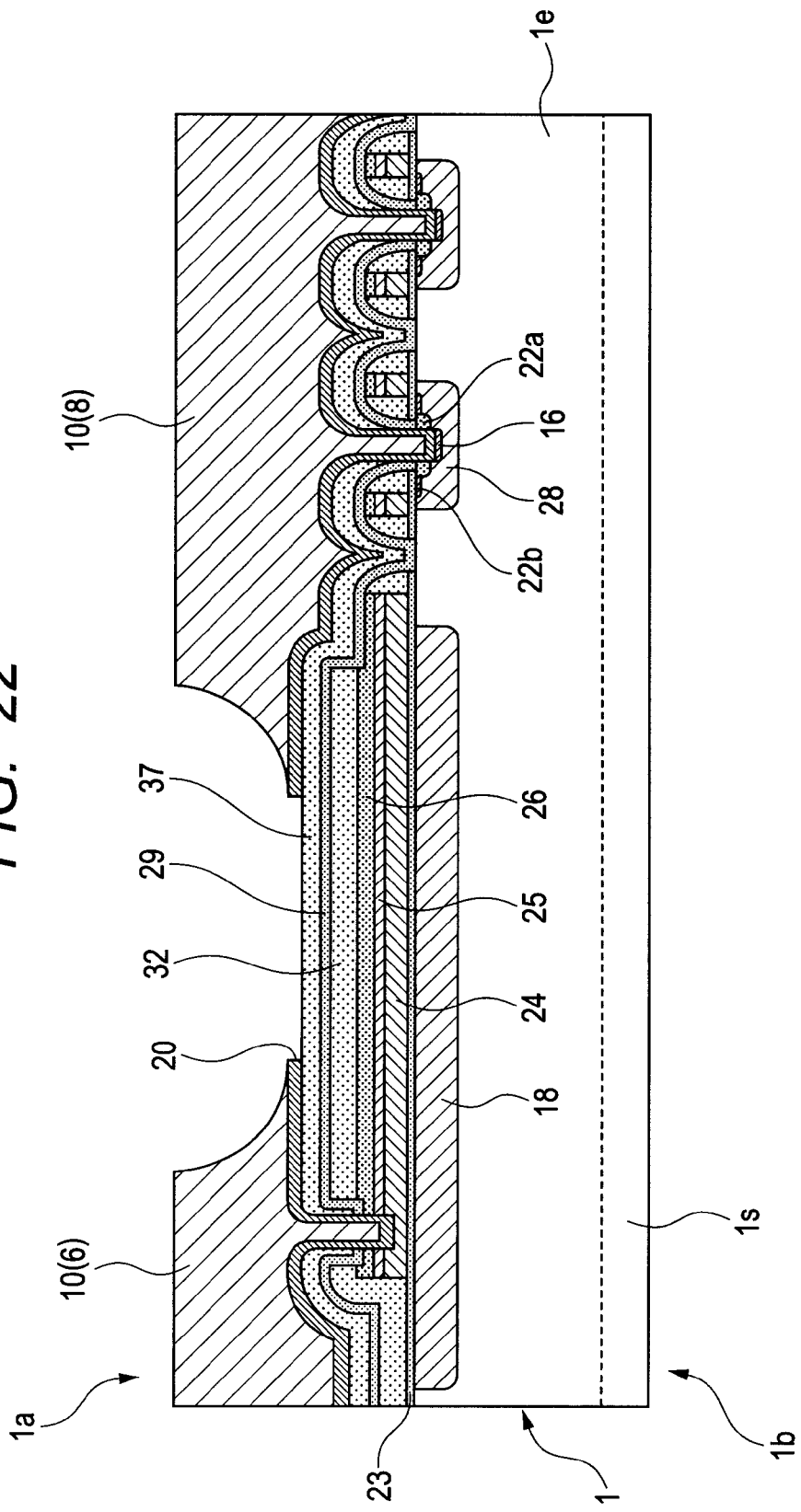

FIG. 13 shows the device from the step of forming a gate insulating film to the step of depositing a hard mask film made of silicon oxide. FIG. 14 shows the device in the step of processing a gate electrode or the like. FIG. 15 shows the device in the step of introduction of ions to form a P-type base region. FIG. 16 shows the device in the step of introduction of ions to form an N-type source extension region. FIG. 17 shows the device in the step of forming a sidewall. FIG. 18 shows the device in the step of introduction of ions to form an N+-type source region. FIG. 19 shows the device in the step of forming a contact hole and the like. FIG. 20 shows the device in the step of depositing a barrier metal film. FIG. 21 shows the device in the step of wet-etching an aluminum metal electrode film. FIG. 22 shows the device in the step of dry-etching a barrier metal film. Based on these figures, the main steps of the wafer process of the power MOSFET will be described.

As shown in FIG. 12, first, for example, an N-type silicon single crystal wafer 1s of 200 mm in diameter with a plane direction (100) is prepared. Wafers of other sizes and having a bore of 300 or 450 mm in diameter, or some other value, and a resistance of, for example, about 1 to 2 mΩ·cm, may instead be prepared. According to a necessary breakdown voltage, an N-type silicon epitaxial layer (doped with, for example, phosphorus, and having a resistance of, for example, 0.1 to 0.3 mΩ·cm) having a thickness of, about 1.3 to 3.3 micrometers is deposited to form a wafer 1 with the epitaxial layer attached thereto. Subsequently, a gate oxide film 23 (gate insulating film) is formed over an upper surface 1a (first main surface) of the wafer 1 with the epitaxial layer, for example, by thermal oxidation (in a thickness of, for example, about 20 to 40 nm). Subsequently, for example, a phosphorus-doped polysilicon film 24 (having a thickness of, for example, about 200 to 400 nm) is deposited over the gate oxide film 23 by chemical vapor deposition (CVD) or the like.

Further, a WSi film 25 (silicide film) having a thickness, for example, of 100 to 200 nm is formed over the polysilicon film 24. The deposition of the WSi film 25 can be performed, for example, by sputtering or the like using a WSi target.

Subsequently, a silicon oxide insulating film is deposited as a gate cap film 26 (having a thickness of, for example, 150 to 350 nm) over the WSi film 25, for example, by the CVD.

Then, as shown in FIG. 14, the silicon oxide insulating film is patterned by dry etching or the like using the gate cap film 26 as a hard mask.

Next, as shown in FIG. 15, a resist film 27 for introducing a P-type base region is formed over the upper surface 1a side of the wafer 1, and then oblique ion implantation is performed (for example, at an inclination angle of about 30 to 45 degrees, and in four directions four times) using the resist film 27 as a mask for ion implantation to thereby form a P-type channel region 28 (P-type base region) and a P-type ring region 18 around the active cell region. Specifically, the conditions for implantation are, for example, as follows. That is, (1) First Step: ions of boron; implantation energy of, for example, about 150 to 250 KeV; and a dose amount (in total when performing implantation four times) of, for example, about $2 \times 10^{12}/cm^2$ to $2 \times 10^{13}/cm^2$, (2) Second Step: ions of boron; implantation energy of, for example, about 70 to 170

KeV; and a dose amount (in total when performing implantation four times) of, for example, about $3 \times 10^{12}/cm^2$ to $3 \times 10^{13}/cm^2$, (3) Third Step: ions of boron; implantation energy of, for example, about 30 to 130 KeV; and a dose amount (in total when performing implantation four times) of, for example, about $4 \times 10^{12}/cm^2$ to $4 \times 10^{13}/cm^2$.

Thereafter, the unnecessary resist film 27 for introduction of the P-type base region is removed.

Then, as shown in FIG. 16, a resist film 31 for introduction of the N-type source extension region is formed over the upper surface 1a of the wafer 1, and the normal ion implantation (for example, vertical implantation) is performed using the resist film 31 as a mask for ion implantation to thereby form an N-type source extension region 22b.

The conditions for ion implantation can be exemplified as follows: ions of arsenic; implantation energy of, for example, about 30 to 90 KeV; and a dose amount in a preferable range of, for example, about $7 \times 10^{13}/cm^2$ to $7 \times 10^{14}/cm^2$. After completion of the ion implantation, the unnecessary resist film 31 for introduction of the N-type source extension region is removed.

Then, as shown in FIG. 17, for example, a silicon oxide insulating film (having a thickness of, for example, 150 to 350 nm) is deposited as the second insulating film 32 for formation of sidewalls over the entire upper surface 1a of the wafer 1 by the CVD using, for example, tetraethylorthosilicate TEOS. Subsequently, a resist film 33 for formation of sidewalls is formed, and anisotropic dry etching is performed using the resist film 33 as a mask to thereby form a sidewall spacer 32w, a hole 34 for coupling, and the like. Thereafter, the unnecessary resist film 33 for formation of the sidewalls is removed.

Then, as shown in FIG. 18, for example, a silicon oxide insulating film (having a thickness of, for example, 10 to 30 nm) is deposited as a sidewall cap film 29 over the entire upper surface 1a of the wafer 1, for example, by the CVD using the TEOS. Subsequently, the resist film 35 for introduction of the N+-type source region is formed over the upper surface 1a of the wafer 1, and for example, vertical ion implantation is performed using the resist film 35 as a mask to thereby introduce an N+-type source region 22a. The conditions for ion implantation can be exemplified as follows: ions of arsenic; implantation energy of, for example, about 30 to 90 KeV; and a dose amount in a preferable range of, for example, about $8 \times 10^{14}/cm^2$ to $8 \times 10^{15}/cm^2$. After completion of the ion implantation, the unnecessary resist film 35 for introduction of the N+-type source region is removed.

Then, as shown in FIG. 19, an interlayer insulating film 37 comprised of, for example, a silicon oxide insulating film or the like is deposited (in a thickness of, for example, of about 150 to 450 nm) over the entire upper surface 1a of the wafer 1. The interlayer insulating film 37 can be exemplified as an appropriate film which is comprised of, for example, a phospho silicate glass film (PSG) and a coated silicon oxide insulating film. The PSG film is deposited by the CVD as a lower layer (for example, in a thickness of about 150 to 350 nm). The silicon oxide insulating film is formed of a spin on glass (SOG) film or the like as an upper layer (for example, in a thickness of about 50 to 150 nm). Subsequently, a resist film for formation of a contact hole is applied and patterned by a normal lithography. The anisotropic dry etching is performed using the patterned resist film for formation of the contact hole as a mask to thereby form a contact hole 36 leading to the silicon substrate, and a coupling hole 38 leading to the polysilicon film 24 of the gate electrode end 17 (see FIG. 6). Subsequently, in this state, the silicon is dug by dry etching, for example, by about 0.1 to 0.3 micrometers in depth. Thereafter, the unnecessary resist film for formation of the contact hole is removed. Subsequently, the vertical ion implantation is performed via the contact hole 36 to thereby introduce a P+-type body contact region 16. The conditions for ion implantation can be exemplified as follows: ions of $BF_2$; an implantation energy of, for example, about 10 to 40 KeV; and a dose amount in a preferable range of, for example, about $8 \times 10^{14}/cm^2$ to $8 \times 10^{15}/cm^2$.

Then, as shown in FIG. 20, for example, a TiW film (for example, containing about 10% by weight of a titanium composition and having a thickness of about 100 to 300 nm) is formed over the entire upper surface 1a of the wafer 1 as the barrier metal film 20 by sputtering or the like (in barrier sputtering step S101 shown in FIG. 12). Thereafter, heat treatment (annealing step S102 shown in FIG. 12) is performed, so that a part of titanium of the TiW film reacts with silicon contained in the lower layer to form a titanium silicide film under the TiW film (note that the titanium silicide film is not shown in the figure for convenience).

Then, as shown in FIG. 21, for example, an aluminum metal electrode film 10 containing aluminum as a principal component (for example, produced by adding about 1% of silicon to high purity aluminum) is deposited in a thickness of about 2500 to 6000 nm over the entire upper surface 1a of the wafer 1 by sputtering (in an aluminum sputtering step S103 shown in FIG. 12). Subsequently, a photoresist film is applied to the entire upper surface 1a of the wafer 1, and patterned by the normal lithography (in an aluminum photolithography step S104 shown in FIG. 12). For example, the aluminum metal electrode film 10 is patterned, for example, by wet etching using the patterned resist film for processing the aluminum metal electrode film or the like as a mask (in an aluminum wet etching step S105 shown in FIG. 12). Thus, the part corresponding to the upper layer gate wiring 6 of the aluminum metal electrode film 10 is isolated from the part corresponding to the metal source electrode 8. Suitable etchant used at this time can preferably be, for example, the so-called mixed acid solution, that is, a mixed solution of acetic acid, nitric acid, water, and phosphoric acid (for example, of about 70 to 80% by weight). After completion of the wet etching, cleaning is performed.

Then, as shown in FIG. 22, an exposed part of the barrier metal film 20 is removed, for example, by isotropic dry etching (in a barrier film etching step S106 shown in FIG. 12). Thereafter, an unnecessary part of the resist film for processing the aluminum metal electrode film or the like is removed (in a resist film removing step S107 shown in FIG. 12).

Then, if necessary, a final passivation film, such as a polyimide film, is formed over the upper surface 1a of the wafer 1.

7. Consideration of Preferred Embodiments and Supplemental Explanation Thereof

In the present embodiment, the metal electrode comprised of the barrier metal film as the lower layer and the aluminum electrode film as the upper layer (which is much thicker than the barrier metal film) is patterned by use of a wet etchant containing a phosphoric acid as a principal component, and further isotropic dry-etching, which will be specifically described below. In this case, when voids exist in the aluminum electrode film between the gate electrodes, other parts of the aluminum electrode film which are not to be etched may be etched by the wet etchant passing through the voids (abnormal side etching) in etching the aluminum electrode film. Similarly, also in the etching of a barrier metal film, the undesired etching may be caused. The wet etchant (having a high viscosity because of a high concentration of phosphoric acid) remains in the void. Upon dry-etching the barrier metal film, the wet etchant moves to the part which is to be etched, which generates etching residue. The problems of the undesired etching and the etching residue may also be generated when changing the wet etching to dry etching. Further, when changing the isotropic dry etching to anisotropic dry etching, these problems may also be caused.

In the embodiment, in order to prevent the abnormal side etching through the voids, the gate electrode coupling portions (or gate electrode coupling bars) exhibiting the dam effect are introduced into a part of the gate structure. That is, the gate electrode coupling portion made of the same laminated member as the gate electrode is provided near the outside of the active cell region with a number of gate electrodes (gate electrode lead portions). The gate electrode coupling portion is provided to have its upper part covered with the metal electrode film so as to be directed substantially perpendicular to the extension direction of the gate electrode lead portion. Thus, the gate electrode coupling portion exhibits the dam effect for preventing the invasion of the etchant (etching solution) from the side.

Accordingly, the gate electrode coupling portion 11, 12 comprises a material suitable for forming a dam that is capable of preventing a metal electrode etchant (such as the aforementioned mixed acid solution) present on one side of the gate electrode coupling portion 11, 12, from etching a portion of the metal electrode (e.g., the aluminum metal electrode film 10) on an opposite side (e.g., the "active cell side) of the gate electrode coupling portion 11, 12. In the case of the first metal electrode 8, the first (near-cell) gate electrode coupling portion 11 serves as a dam to prevent wet etchant from reaching the aluminum metal electrode film 10 on the active cell region side 7. Similarly, in the case of upper layer gate wiring 6, the second (gate end) gate electrode coupling portion serves as a dam to prevent wet etchant from reaching portions of the aluminum metal electrode film 10 located over the gate electrode end 17.

8. Summary

Although the invention made by the inventors has been specifically described based on the embodiments, the invention is not limited thereto. It is apparent that various modifications and changes can be made to the invention without departing from the scope of the invention.

For example, in the embodiments, the N-channel type device has been mainly described specifically, but the invention is not limited thereto. It is needless to say that the invention can also be applied to a P-channel device almost as it is.

Although the above embodiments have mainly described the single device specifically, the invention is not limited thereto. Obviously, the invention can also be applied to a composite semiconductor chip (semiconductor device) incorporating such an insulated gated power transistor substantially as it is.

Further, although the above embodiments have mainly described the silicon device specifically, for example, the invention is not limited thereto. It goes without saying that the invention can also be applied to other devices using substrate material belonging to other series, such as SiC based or SiN based material, substantially as it is.

The embodiments have specifically described the device using, as a main surface metal, the electrode (aluminum electrode) including a metal layer as a main component which contains aluminum as a principal component. However, it is apparent that the invention is not limited thereto, and can also be applied to devices using other electrode metals, such as a tungsten electrode, substantially as it is.

What is claimed is:

1. A power semiconductor device, comprising:
   (a) a semiconductor chip with first and second main surfaces;
   (b) a plurality of gate electrodes provided via a gate insulating film so as to protrude outward from an inside of an active cell region over the first main surface of the semiconductor chip;
   (c) a first gate electrode coupling portion integrally coupling intermediate parts of the gate electrodes together outside the active cell region over the first main surface of the semiconductor chip;
   (d) an interlayer insulating film covering the gate electrodes and the first gate electrode coupling portion over the first main surface of the semiconductor chip; and
   (e) a first metal electrode covering the active cell region and surroundings thereof over the interlayer insulating film,
   wherein the first gate electrode coupling portion comprises at least two coupling bars next to one another;
   wherein the first gate electrode coupling portion between the gate electrodes is covered with the first metal electrode; and
   wherein the first metal electrode comprises:
   (e1) a barrier metal film; and
   (e2) a metal electrode film provided over the barrier metal film, and containing aluminum as a principal component, said metal electrode film being thicker than the barrier metal film.

2. The semiconductor device according to claim 1, wherein each of the coupling bars is substantially linear.

3. The semiconductor device according to claim 2, wherein each of the coupling bars has substantially the same width as that of each of the gate electrodes.

4. The semiconductor device according to claim 3, wherein no insulating film which is thicker than the gate insulating film exists between the first main surface of the semiconductor chip and the gate electrode coupling portion.

5. The semiconductor device according to claim 2, wherein the width of each of the coupling bars is wider than that of each of the gate electrodes.

6. The semiconductor device according to claim 1, wherein the first gate electrode coupling portion is formed of the same layer material as that of the gate electrodes.

7. The semiconductor device according to claim 1, wherein the power semiconductor device is a power MISFET including a linear gate electrode structure.

8. The semiconductor device according to claim 7, wherein the power semiconductor device is a power MISFET having a planar structure.

9. The semiconductor device according to claim 8, wherein the power semiconductor device is a split gate power MISFET having a planar structure.

10. A power semiconductor device including a semiconductor chip comprising:
    an active cell region;
    a non-cell region adjacent to the active cell region;
    a plurality of spaced apart gate electrodes extending linearly along a first direction, each gate electrode having a first portion in the active cell region connected to a second portion in the non-cell region, the second portion terminating at a gate electrode end in the non-cell region;
    a first gate electrode coupling portion extending along a second direction transverse to the first direction and intersecting second portions of said plurality of gate electrodes in the non-cell region, the first gate electrode coupling portion being integrally formed with the gate electrodes, and occupying a same depth level in the semiconductor chip;
an interlayer insulating film overlying the gate electrodes and also the first gate electrode coupling portion; and
a first metal electrode overlying the first portions of the gate electrodes and the first gate electrode coupling portion, but not overlying the gate electrode ends; wherein:
the first gate electrode coupling portion comprises at least two parallelly extending coupling bars; and
each coupling bar intersects second portions of said plurality of gate electrodes in the non-cell region.

11. The power semiconductor device according to claim 10, wherein:
the first gate electrode coupling portion comprises a material suitable for forming a dam that is capable of preventing a first metal electrode etchant present on one side of the first gate electrode coupling portion from etching a portion of the first metal electrode which is located between two of said plurality of gate electrodes on an opposite side of the first gate electrode coupling portion.

12. The power semiconductor device according to claim 10, wherein:
the first metal electrode comprises a barrier metal film and a metal electrode film formed over the barrier metal film; and
the metal electrode film is thicker than the barrier metal film.

13. The power semiconductor device according to claim 10, wherein:
each coupling bars has substantially the same width as that of each of the gate electrodes.

14. The power semiconductor device according to claim 10, wherein:
each coupling bar has a width greater than that of each of the gate electrodes.

15. A power semiconductor device including a semiconductor chip comprising:
an active cell region;
a non-cell region adjacent to the active cell region;
a plurality of spaced apart gate electrodes extending linearly along a first direction, each gate electrode having a first portion in the active cell region connected to a second portion in the non-cell region, the second portion terminating at a gate electrode end in the non-cell region;
a first gate electrode coupling portion extending along a second direction transverse to the first direction and intersecting second portions of said plurality of gate electrodes in the non-cell region, the first gate electrode coupling portion being integrally formed with the gate electrodes, and occupying a same depth level in the semiconductor chip;
an interlayer insulating film overlying the gate electrodes and also the first gate electrode coupling portion;
a first metal electrode overlying the first portions of the gate electrodes and the first gate electrode coupling portion, but not overlying the gate electrode ends; and
a second gate electrode coupling portion which is:
parallel to the first gate electrode coupling portion;
located farther from the active cell region than the first gate electrode portion;
intersects the second portions of the gate electrodes; and
is integrally formed with both the gate electrodes and the first gate electrode coupling portion.

16. The power semiconductor device according to claim 15, further comprising:
an upper layer gate wiring overlying the second gate electrode coupling portion and being connected to the gate electrode ends.

17. The power semiconductor device according to claim 16, wherein:
the upper layer gate wiring is formed of the same material as the first metal electrode; and
the upper layer gate wiring is isolated from the first metal electrode.

18. The power semiconductor device according to claim 17, wherein:
the gate electrode coupling portions comprise a material suitable for forming a dam that is capable of preventing a first metal electrode etchant present on one side of a given gate electrode coupling portion from etching a portion of either the first metal electrode or the upper layer gate wiring, located on an opposite side of said given gate electrode coupling portion.

19. The power semiconductor device according to claim 18, wherein:
the first gate electrode coupling portion comprises at least two parallelly extending coupling bars, and each coupling bar intersects second portions of said plurality of gate electrodes in the non-cell region; and
the first metal electrode comprises a barrier metal film and a metal electrode film formed over the barrier metal film, the metal electrode film being thicker than the barrier metal film.

20. The power semiconductor device according to claim 17, wherein:
the first gate electrode coupling portion comprises at least two parallelly extending coupling bars, and each coupling bar intersects second portions of said plurality of gate electrodes in the non-cell region; and
the first metal electrode comprises a barrier metal film and a metal electrode film formed over the barrier metal film, the metal electrode film being thicker than the barrier metal film.

* * * * *